(12) United States Patent
Seshadri et al.

(10) Patent No.: US 6,965,520 B1
(45) Date of Patent: Nov. 15, 2005

(54) DELAY SYSTEM FOR GENERATING CONTROL SIGNALS IN FERROELECTRIC MEMORY DEVICES

(75) Inventors: Anand Seshadri, Plano, TX (US); Jarrod R. Eliason, Colorado Springs, CO (US); Edwin Cezar Jabillo, The Colony, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/910,508

(22) Filed: Aug. 3, 2004

(51) Int. Cl.[7] ............................................. G11C 11/22
(52) U.S. Cl. .................. 365/145; 365/194; 365/230.06
(58) Field of Search .......................... 365/145, 189.01, 365/189.11, 194, 230.06; 327/276, 277, 270, 327/271, 272

(56) References Cited

U.S. PATENT DOCUMENTS

| | | | |
|---|---|---|---|
| 5,266,850 A | | 11/1993 | Au et al. |
| 5,548,550 A | * | 8/1996 | Zanders et al. ......... 365/185.08 |
| 6,184,726 B1 | * | 2/2001 | Haeberli et al. .............. 327/96 |
| 6,204,710 B1 | | 3/2001 | Goetting et al. |
| 6,229,364 B1 | | 5/2001 | Dortu et al. |
| 6,246,274 B1 | | 6/2001 | Sakai et al. |
| 6,310,506 B1 | | 10/2001 | Brown |
| 6,356,132 B1 | | 3/2002 | Mastrocola et al. |
| 6,637,008 B1 | * | 10/2003 | Higuchi et al. ................. 716/2 |
| 6,664,837 B1 | | 12/2003 | Oh et al. |
| 6,894,943 B2 | * | 5/2005 | Suzuki et al. .......... 365/230.03 |

* cited by examiner

*Primary Examiner*—Gene N. Auduong
(74) *Attorney, Agent, or Firm*—Jacqueline J. Garner; W. James Brady, III; Frederick J. Telecky, Jr.

(57) ABSTRACT

Ferroelectric memory devices and control circuits therefor are presented, in which memory array control and timing signals are derived according to tap outputs from a group of series connected delay elements. Some or all of the individual delay elements comprise one or more trim inputs and a variable delay circuit that provides an output signal a variable delay time after the delay element input signal, where the variable delay is set according to the trim inputs, allowing the control signals to be adjusted or trimmed to accommodate fabrication process variations.

26 Claims, 17 Drawing Sheets

DELAY SYSTEM FOR GENERATING CONTROL SIGNALS IN FERROELECTRIC MEMORY DEVICES

FIELD OF INVENTION

The present invention relates generally to semiconductor devices and more particularly to trimmable delay systems for generating control signals in a ferroelectric memory device.

BACKGROUND OF THE INVENTION

In semiconductor memory devices, data is read from or written to cells in a memory array according to decoded address information and various other control signals. Such memory devices are used for storage of data and/or program code in personal computer systems, embedded processor-based systems, video image processing circuits, communications devices, and the like. Ferroelectric memory, sometimes referred to as FERAM or FRAM memory, provides for storage of data in ferroelectric capacitors, wherein ferroelectric memory cells are commonly provided in single-transistor, single-capacitor (1T1C) or two-transistor, two-capacitor (2T2C) configurations. Ferroelectric memories provide certain performance advantages over other forms of non-volatile data storage devices, such as flash and EEPROM type memories. For example, ferroelectric memories offer short programming (e.g., write access) times and low power consumption. In a folded bitline array architecture comprised of 1T1C cells, the individual ferroelectric memory cells typically include a ferroelectric (FE) cell capacitor adapted to store a binary data bit as a polarization state of the capacitor, as well as a MOS access transistor that operates to selectively connect the FE capacitor to one of a pair of complementary bitlines, with the other bitline being connected to a reference voltage. The individual cells are commonly organized as individual bits of a corresponding data word, where the cells of a given word are accessed concurrently by activation of platelines and wordlines by address decoding control circuitry.

Ferroelectric memory devices typically include a number of individually addressable memory cells arranged in an array configuration, wherein the array is typically organized as a matrix of rows and columns. Conventionally, data is stored into a memory array as a row, and read out from the memory array as a row, where the row typically consists of 8, 16, 32, or 64 bits of binary data. During a write operation, row decoder control circuitry provides a plateline pulse signal to first sides of the ferroelectric cells in a data row, the other sides of which are connected to the array bitlines to receive the data. In a read operation, the decoder provides plateline pulses to the first side of each ferroelectric memory cell in a data row, and sense amplifiers (sense amps) are connected to the other side of the cells to sense a row of stored data bits in parallel fashion. Thus, in a single read operation, an entire row of data bits (e.g., 8, 16, 32, or 64 bits) are obtained from the memory cells in the selected row.

The ferroelectric cell capacitors provide data storage in which the ferroelectric dielectric material of the cell capacitors is polarized in one direction or another in order to store a binary value. The ferroelectric effect allows for non-volatile retention of a stable polarization in the absence of an applied electric field due to the alignment of internal dipoles within perovskite crystals in the ferroelectric material. This alignment may be selectively achieved by application of an electric field in a first direction that exceeds a coercive field of the material. Conversely, reversal of the applied field reverses the internal dipoles, wherein the response of the polarization of a ferroelectric capacitor to the applied voltage may be plotted as a hysteresis curve.

In a read operation, a reference voltage is typically provided at a first bitline, and the target cell capacitor is connected between a complementary bitline and a plateline pulse signal, thereby causing an electric field to be applied to the cell capacitor. If the applied field is in a direction to switch or reverse the internal dipoles, more charge will be moved than if the dipoles are not reversed. The resulting charge transfer creates a voltage on the data (complementary) bitline. The data bitline voltage, along with the reference voltage on the other bitline, provides a differential voltage on the bitline pair, which is coupled to inputs of a differential sense amp circuit. The sense amp is typically a latch type circuit that measures the charge applied to the cell bitlines and produces either a logic "1" or "0" differential voltage at the sense amp terminals. The reference voltage is typically supplied at an intermediate voltage between the voltage associated with a capacitor storing a binary "0" and that of the capacitor storing a binary "1".

The polarity of the sensed differential voltage thus represents the data stored in the cell, which is buffered (e.g., latched) by the sense amp and provided to a pair of local IO lines. Reading the data from a ferroelectric memory cell is a destructive operation, in which the previous polarization state of the cell capacitor is not necessarily maintained after reading. Accordingly, the sensed data is restored to the cell following each read operation by application of another pulse to the cell plateline while the sense amp is enabled. In a write operation, an electric field is applied to the cell capacitor by the sense amp or a write buffer, in combination with a plateline activation pulse to polarize the capacitor to the desired data state.

Read/restore and write operations, including the transfer of data between the ferroelectric memory cells, the sense amp circuits, local I/O circuitry, and the local data bitlines, are controlled by various access transistors, typically MOS devices, with switching signals being provided by control circuitry including address decoders and timing circuits in the device. Such control circuitry generates control signals to trigger a large number of events for controlling wordlines, platelines, precharge devices, sense amps, etc. during memory access operations, wherein the control events are often interdependent and need to follow a certain sequence.

To operate a ferroelectric memory device, whether a stand-alone memory with external address and data I/O connections, or a ferroelectric memory array included within a semiconductor device along with other circuits, various control and timing signals are needed. Conventional timing and control circuits employ a timing or delay chain having a number of series connected fixed delay elements, with a tap at each delay element output that is coupled to a control logic circuit. The control logic circuit generates or derives control signals (e.g., wordline signals, plateline pulses, sense amp enable signals, precharge signals, etc.) according to the delay chain tap outputs.

In manufactured semiconductor devices, electrical circuit component values and overall circuit performance vary based on fabrication processing conditions (e.g., process variation), operating voltages (e.g., voltage variation), and/or operating temperatures (e.g., temperature variations), which are sometimes collectively characterized as process-temperature-voltage (PTV) variations. In typical ferroelectric memory devices, ferroelectric cell capacitors are fabricated in a layer formed above the substrate level in which the cell transistors and control logic transistors are fabricated. The operating parameters of transistors and other electric components in the control circuit delay chain elements typically vary with PTV. Also, the properties of the memory cell access transistors and ferroelectric capacitors vary over PTV.

The PTV variations of the timing and control circuit delay elements, however, typically do not track the PTV variations in the ferroelectric cell capacitors. In particular, CMOS process variations do not necessarily track with the ferroelectric cell capacitor process variations. For example, variations in ferroelectric cell capacitors create a variation in the load of the control circuit plateline drivers, which is typically not correlated to CMOS variations for the plateline driver transistors. The time required to polarize ferroelectric capacitors also varies with processing conditions, temperature, and voltage, where the polarization time is important for read and write operations in high speed (e.g., low access time) memory devices, especially at cold temperatures and low operating voltage, where domain nucleation can be slowed. Minimizing the variability in timing is important in maximizing the reliability of ferroelectric memories. Previously, such variances have been addressed by designing in a significant margin for process variations. However, this is not an option for high performance stand-alone FERAMs and other semiconductor devices that incorporate ferroelectric memory. Accordingly, there is a need for improved delay circuits or control systems for generating control signals in a ferroelectric memory device.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later. The invention provides trimmable delay systems for use in generating control and timing signals for ferroelectric memory devices, in which one or more delay elements in a delay chain are adjustable. This adjustable delay system allows the control signals to be trimmed to account for process variations, thereby facilitating the production of high performance ferroelectric memory devices with high fabrication yield and high reliability, even in the presence of such process variations. In addition, real-time adjustment is optionally provided for the trimmable delay systems, so as to reduce voltage and/or temperature variations.

In accordance with an aspect of the present invention, ferroelectric memory devices and delay systems therefor are provided, comprising a plurality of series connected delay elements. The delay elements individually comprise a delay circuit that provides a delayed output signal some time after receipt of an input signal, wherein one or more of the delay elements are adjustable or trimmable. The trimmable delay elements comprise one or more trim inputs and a variable delay circuit that receives an input signal and provides an output signal a variable delay time after the input signal, wherein the variable delay time is set according to the trim input(s). The delay system further comprises a trim select circuit for providing one or more trim outputs to control the variable delay time of the trimmable delay elements, where the trim select circuit can include non-volatile storage for the trim output values.

The trimmable delay elements may be implemented in a variety of ways. In one example, the trimmable delay element comprises a trimmable delay chain including a plurality of delay components coupled along a plurality of possible signal paths between the signal input and a delay chain output, as well as switching circuitry that couples certain ones of delay components between the signal input and the delay chain output according to the trim inputs to set the variable delay time. In another example, the trimmable delay element comprises a plurality of delay chains and a multiplexer that selectively couples one of the delay chain outputs to the signal output of the trimmable delay element according to the trim inputs. In other possible examples, the variable delay circuit comprises an RC network with a resistor and a capacitor and one or more drive transistors, wherein values of the resistor and the capacitor and/or the transistor drive current capability (e.g., drive strength) are trimmable according to the trim input(s) to control the variable delay time.

The following description and annexed drawings set forth in detail certain illustrative aspects and implementations of the invention. These are indicative of only a few of the various ways in which the principles of the invention may be employed.

DETAILED DESCRIPTION OF THE INVENTION

Figure 1A:
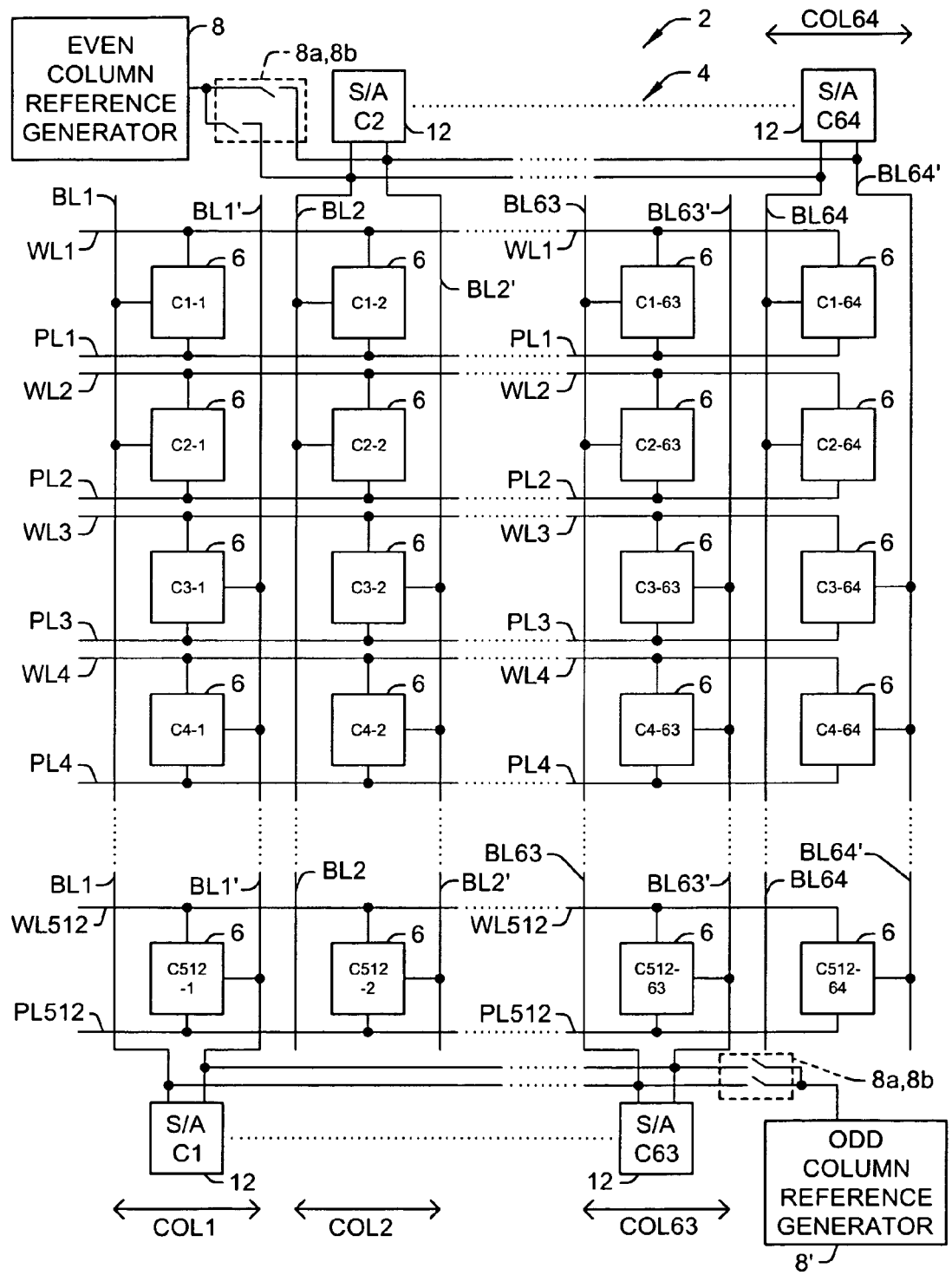
FIG. 1A is a schematic diagram illustrating a portion of an exemplary ferroelectric memory device in which one or more aspects of the invention may be implemented.

One or more implementations of the present invention will now be described with reference to the attached drawings, wherein like reference numerals are used to refer to like elements throughout.

Figure 1B:
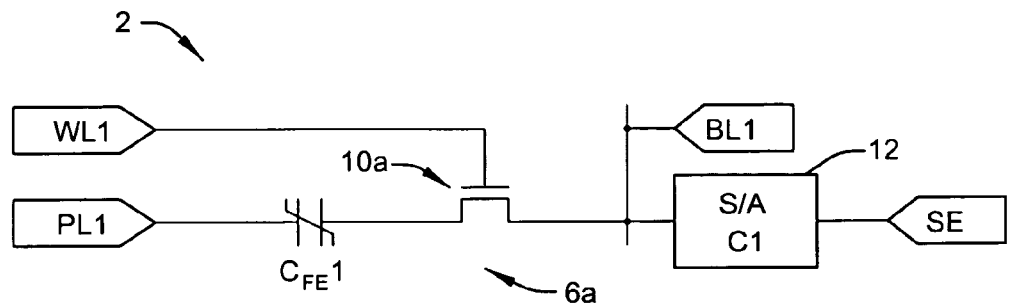
FIG. 1B is a schematic diagram illustrating a 1T1C ferroelectric memory cell and an associated sense amp in the memory device of FIG. 1A.
Figure 1C:
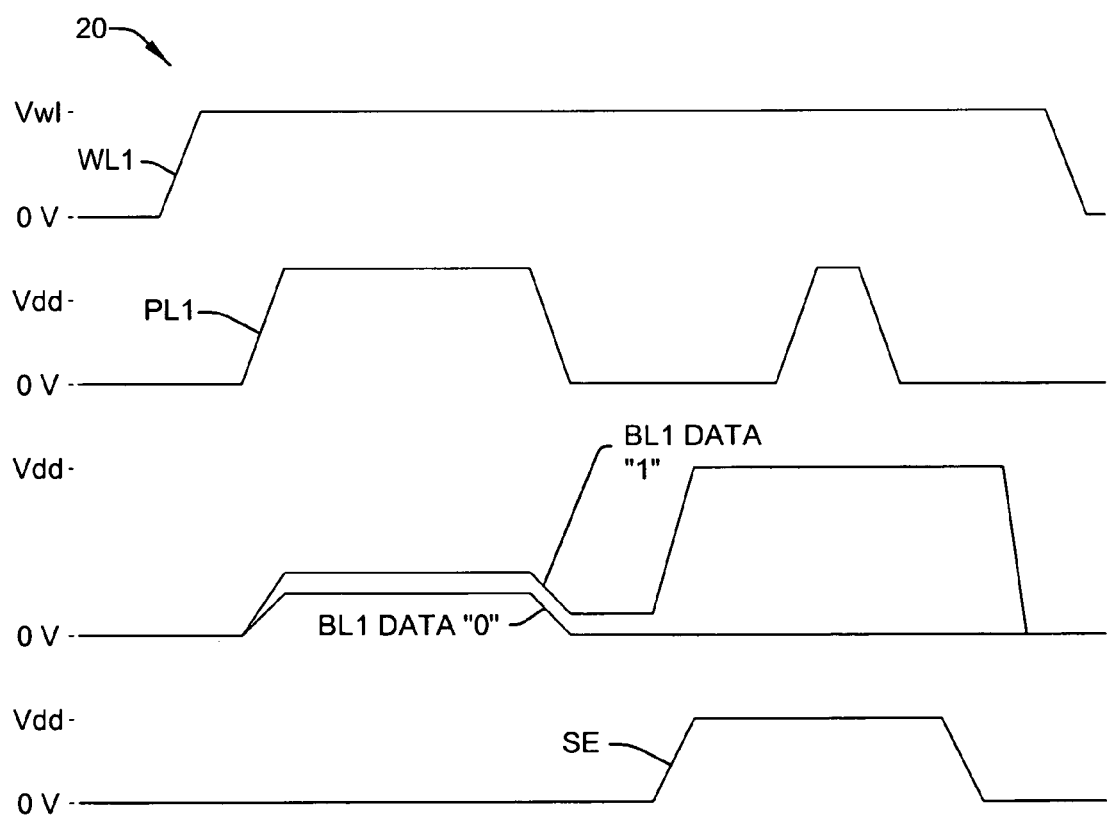
FIG. 1C is a waveform diagram illustrating a read operation in the cell of FIGS. 1A and 1B.
Figure 1D:
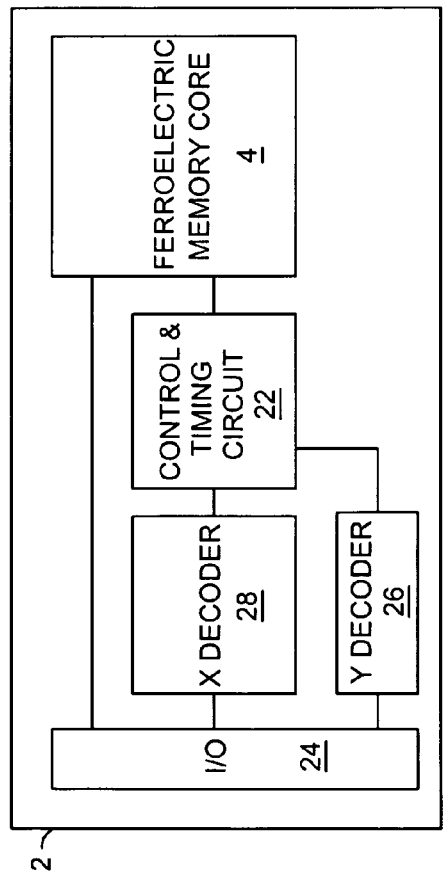
FIG. 1D is a simplified schematic diagram illustrating the major components in the ferroelectric memory device of FIGS. 1A–1C, including an exemplary control and timing circuit with a trimmable delay system in accordance with the invention.

FIGS. 1A–1D illustrate a ferroelectric memory device 2 having a control and timing circuit 22 with a trimmable delay system in accordance with the present invention. Referring initially to FIG. 1D, a simplified illustration is provided of certain major components of the exemplary semiconductor device 2. The device 2 comprises a semiconductor substrate in which one or more high-density core regions and one or more low-density peripheral portions are formed. The core regions comprise one or more M×N array cores 4 of individually addressable, substantially identical 1T1C ferroelectric memory cells 6, one of which is illustrated in FIG. 1B below.

The peripheral portions comprise I/O circuitry 24, and programming or decoder circuitry 26 and 28 for selectively addressing the individual memory cells 6 or groups (e.g., words) thereof. The programming circuitry comprises one or more x-direction (e.g., column) decoders 28 and y-direction (e.g., row) decoders 26, which, together with the I/O circuitry 24 and control and timing circuitry 22, operate to couple the ferroelectric cell capacitors $C_{FE}$ of selected addressed memory cells 6 with predetermined voltages or impedances during read, restore and/or write operations. In this regard, the control and timing circuit 22 provides the necessary wordline, bitline, plateline, sense amp enable, precharge, and other control signals during memory access operations in the device 2, and also operates to buffer the incoming and outgoing data associated therewith, wherein the circuits 22, 24, 26, and 28 may be fashioned from any suitable analog and/or logic circuits and devices within the scope of the invention.

FIG. 1A illustrates a portion (e.g., a 32 k segment) of a memory core array 4 in the device 2, including memory cells 6 organized in a folded bitline array architecture, including a segment in FIG. 1A with 512 rows (words) and 64 columns (bits) of data storage cells 6 indicated as $C_{ROW\text{-}COLUMN}$, where each column of cells 6 is accessed via a pair of complementary bitlines $BL_{COLUMN}$ and $BL_{COLUMN}'$. In the first row of the device 2, for example, the cells C1-1 through C1-64 form a 64 bit data word accessible via complementary bitline pairs BL1/BL1' through BL64/BL64' by activation of a wordline WL1. The cell data is sensed during data read operations using sense amp circuits 12 (S/A C1 through S/A C64) associated with columns 1 through 64, respectively.

As illustrated further in FIG. 1B, an exemplary cell 6a is formed as a 1 T1C cell including a single ferroelectric cell capacitor $C_{FE}1$ and a MOS type cell access transistor 10a that selectively connects the cell capacitor $C_{FE}1$ between one of the complementary bitlines BL1 associated with the cell column and a plateline PL1 according to a wordline control signal WL1. During memory accesses, the other bitline BL1' is selectively connected to a reference voltage generator 8 or 8' via one of a pair of switches 8a, 8b (FIG. 1A), depending upon which word is being accessed. In the device 2, cells along WL1 and WL2 (as well as those along WL5, WL6, WL9, WL10, . . . , WL509, WL510) are coupled with bitlines BL1–BL64, whereas cells along WL3 and WL4 (as well as those along WL7, WL8, WL11, WL12, . . . , WL511, WL512) are coupled with bitlines BL1'–BL64'. In reading the first data word along the wordline WL1, the cells C1-1 through C1-64 are connected to the sense amps 12 via the bitlines BL1, BL2 . . . . BL63, and BL64 while the complementary reference bitlines BL1', BL2' . . . , BL63', and BL64' are connected to the reference voltage generators 8, 8'.

FIG. 1C provides a simplified timing diagram 20 showing various control signals provided to the array core 4 by the control and timing circuit 22, as well as signals on various nodes during a read and restore operation in the device 2 to access cells along WL1. During a read operation, a signal level $V_1$ or $V_0$ is obtained on the array bitline BL1, depending upon the state of the data being read from the cell 6a (e.g., binary "1" or "0", respectively). A reference voltage $V_{REF}$ from the reference generators 8, 8' is ideally between V, and $V_0$, which is applied to the complementary bitline BL1' (e.g., the other input of the sense amp 12).

To read the data stored in the cell, the transistor 10a is turned on by applying a wordline activation voltage Vwl which is typically greater than or equal to a supply voltage Vdd plus a threshold voltage of the transistor 10a via the wordline WL1 to couple the bitline BL1 to the capacitor $C_{FE}1$. The plateline PL1 is then pulsed high, as illustrated in FIG. 1C, to cause charge sharing between the ferroelectric capacitor $C_{FE}1$ and the capacitance of the bitline BL1, by which the bitline voltage BL1 rises, depending upon the state of the cell data being read. The plateline PL1 is then returned to 0V and the sense amp 12 is activated via a sense amp enable signal SE. One input terminal of the sense amp 12 is coupled to the cell bitline (e.g., data bitline BL1) and the other differential sense amp input is coupled to a reference voltage (e.g., reference bitline BL1' in this example). In the example of FIGS. 1A–1C, the sense amp 12 is enabled after the plateline signal PL1 is again brought low, a technique referred to as "pulse sensing". Alternatively, "step sensing" can be used in the device 2, in which the sense amp is enabled via the SE signal while the plateline pulse PL1 is still high. Following a cell data read, the data is restored to the cell 6a by again pulsing the plateline high and then low while the wordline WL1 is asserted to reprogram the cell capacitor $C_{FE}1$.

Figure 2:
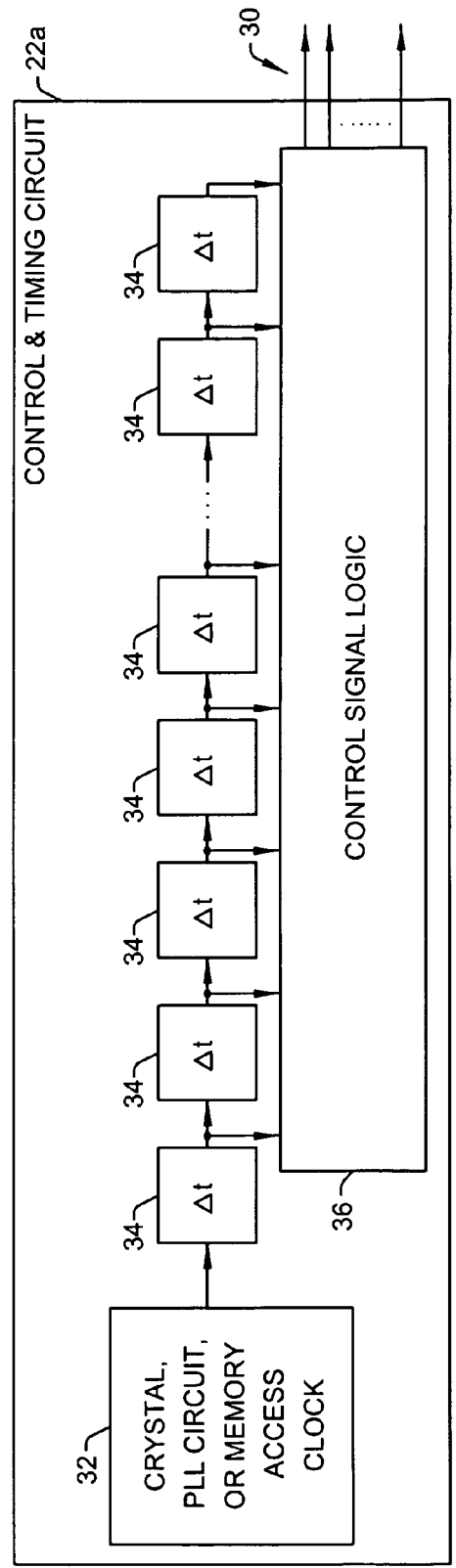
FIG. 2 is a schematic diagram illustrating a conventional control circuit for generating ferroelectric memory control signals, consisting of a delay chain with fixed delay elements connected in series, with a tap at each delay element output that is coupled to a control signal logic circuit.

The control and timing circuit 22 of FIG. 1D provides the necessary plateline, wordline, sense amp enable, precharge, and other operational control signals to carry out read/restore and write operations according to decoded address information from the decoder circuits 26 and 28 in the device 2. In conventional devices, the control and timing signals were derived from a string of fixed delay circuits or delay elements. FIG. 2 illustrates a conventional control circuit 22a for generating such control signals 30, consisting of a crystal, phase locked loop (PLL), or synchronous or asynchronous memory access signal 32 that provides a signal input to a chain of fixed delay elements 34 connected in series, with a tap at the output of each delay element 34 coupled to a control signal logic circuit 36. The signal logic 36 includes logic transistors and other components that derive the control signals 30 according to the tap outputs of the fixed delay elements 34 to provide the necessary plateline, wordline, enable, and other control signals to operate a ferroelectric memory device. However, as noted above, fabrication process variations of the fixed delay elements 34 do not normally track process variations in the ferroelectric cell capacitors $C_{FE}$ in the array 4.

Figure 3A:
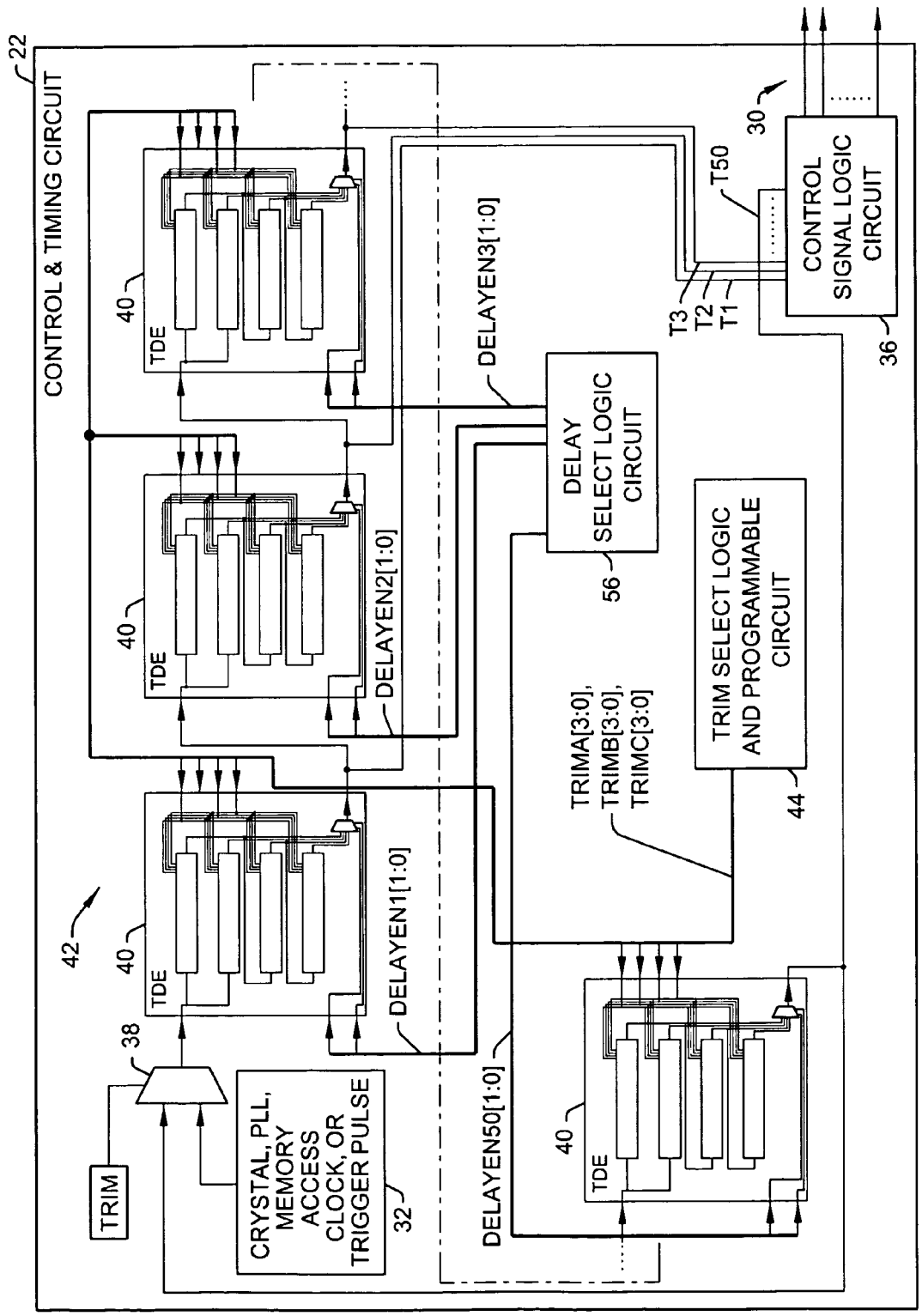
FIGS. 3A and 3B are schematic diagrams illustrating a control and timing circuit in the device of FIGS. 1A–1D having an exemplary delay system with a plurality of series connected trimmable delay elements in accordance with the invention.
Figure 3B:
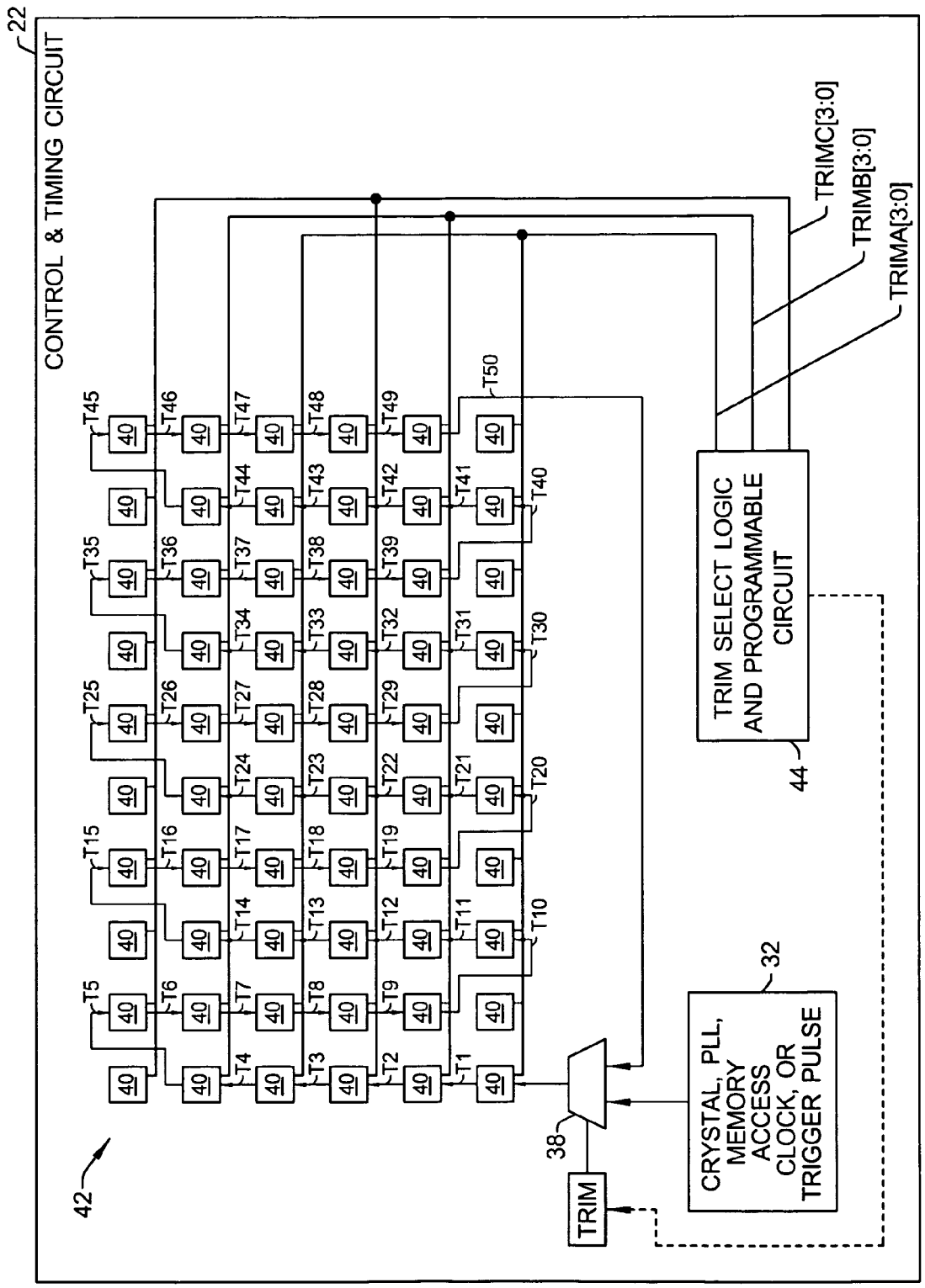

Referring now to FIGS. 3A and 3B, the present invention provides control and timing circuitry 22 with trimmable or adjustable delay elements 40 configured in series to form a delay chain, allowing trimming or adjustment for process or other variations. FIG. 3A illustrates an exemplary control and timing circuit 22 that can be employed in the ferroelectric memory device 2 of FIGS. 1A–1D above, or which may be used in other devices. The circuit 22 provides a trimmable delay system for generating control signals 30 in the device 2, comprising a delay chain formed by a plurality of series connected trimmable delay elements (TDEs) 40. The delay elements 40 each have a signal input (e.g., TAPIN in the examples of FIGS. 4–5B below), a signal output (e.g., TAPOUT in FIGS. 4–5B), and a delay circuit that receives an input signal from the signal input and provides an output signal to the signal output delayed in time after the input signal.

The delay elements 40 are configured in a chain 42, with first and last delay elements 40 and intermediate delay elements 40 coupled in series therebetween, wherein the signal inputs (TAPIN) of the intermediate delay elements 40 and the last delay element 40 are coupled with the signal output (TAPOUT) of the immediately preceding delay element 40, and the signal input (TAPIN) of the first delay element 40 is coupled with a system input from a crystal, PLL circuit, or memory access signal 32 via a multiplexer (MUX) 38. The multiplexer 38 operates to selectively couple the signal input of the first delay element 40 with either the system input from the crystal 32 or with the signal output of the last delay element 40 according to a TEST control signal. This allows the delay chain 42 to be placed into a continuous delay loop mode for evaluating the delay time or loop frequency of the system wherein the measured loop frequency/delay time may be used to adjust or trim one or more of the delay elements 40 as described further below.

The delay chain 42 may comprise any integer number of delay elements 40, wherein the illustrated delay chain 42 comprises 49 delay elements 40. As illustrated in FIG. 3B, the exemplary delay system includes sixty delay elements 40 arranged in an array of ten columns and six rows, wherein ten of the delay elements 40 are not used. The remaining delay elements 40 are coupled in series as shown in FIG. 3B to form the delay chain 42, with the signal outputs T1–T50 (TAPOUT) of these delay elements 40 being coupled with a control signal logic circuit 36 that generates the ferroelectric memory control signals 30 according to one or more of the delay element signal outputs T1–T50. The control signal logic circuit 36 can be any suitable circuit with transistors and other components (not show) for creating appropriate ferroelectric memory control signals 30 (e.g., plateline pulses, wordline signals, sense amp enable signals, precharge signals, etc.) in the device 2.

In accordance with the invention, the delay elements 40 are adjustable or trimmable, and comprise a variable delay circuit that receives an input signal from the signal input TAPIN and provides an output signal to the signal output TAPOUT a variable delay time after the input signal, wherein the variable delay time is set according to trim inputs TRIM[3:0]. The delay system further comprises a trim select circuit 44 that provides the trim input signals TRIM[3:0] to control the variable delay time, where the trim select circuit 44 can be any suitable logic circuitry for setting the trim signals TRIM[3:0], which may be externally controllable for trimming after device fabrication, and may include non-volatile storage to retain the adjusted trim signal values. In the exemplary control and timing circuits 22 illustrated and described herein, each of the delay elements 40 are trimmable. However, other implementations of the invention are possible in which one or more of the delay elements 40 are fixed, with at least one delay element 40 being trimmable to provide a variable delay time, wherein all such alternative implementations are contemplated as falling within the scope of the present invention and the appended claims.

Figure 4:
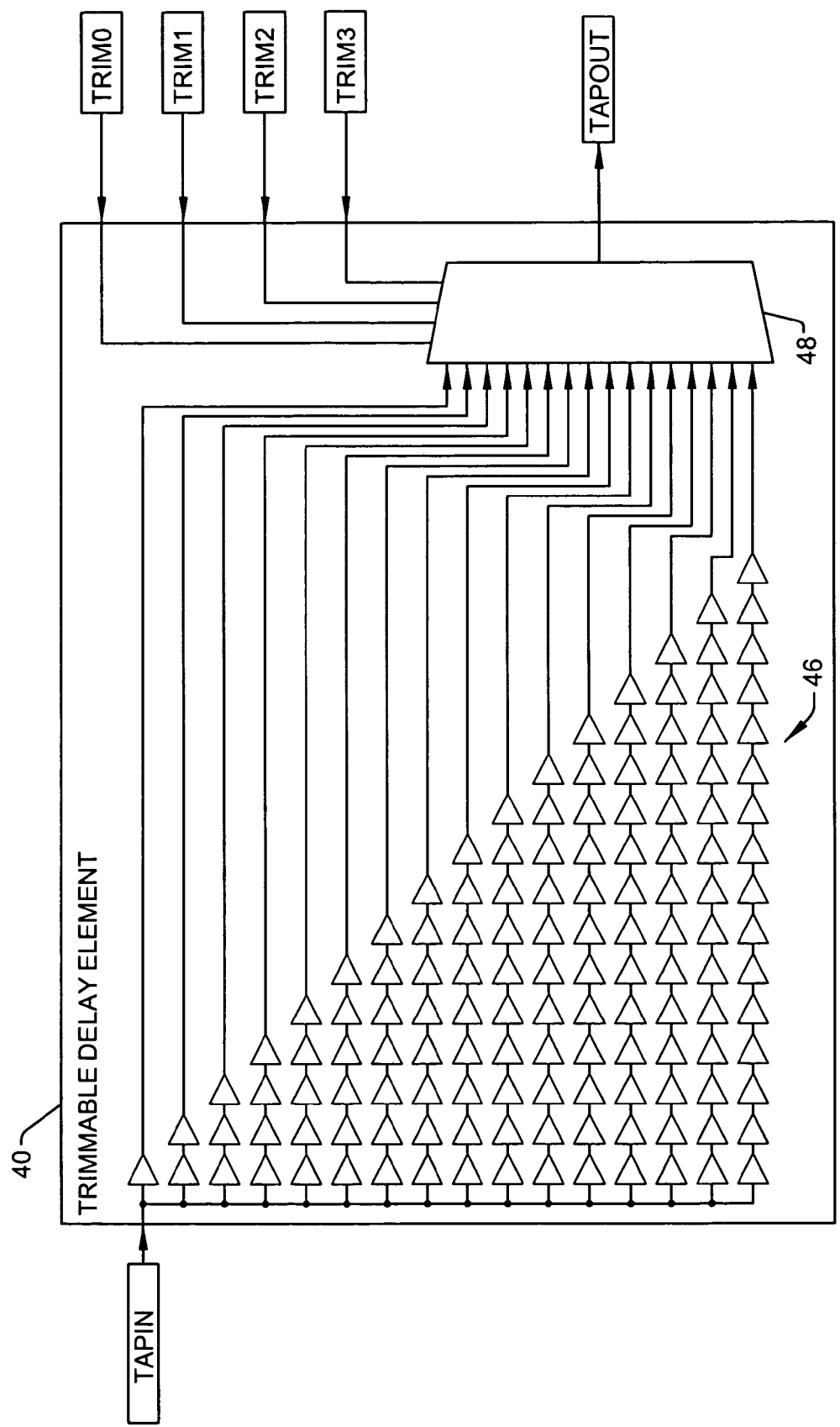
FIG. 4 is a schematic diagram illustrating one implementation of a trimmable delay element in accordance with the invention, comprising a plurality of delay chains and a multiplexer that selectively couples one of the delay chain outputs to the signal output of the trimmable delay element according to trim inputs.

The trimmable delay elements 40 of the invention may be implemented in a variety of ways using any suitable circuitry and electrical components that provide a variable delay time according to one or more trim inputs. FIG. 4 illustrates one possible trimmable delay element 40 comprising a plurality of delay chains 46 and a multiplexer 48 that selectively couples one of the delay chain outputs to the signal output TAPOUT according to the trim inputs TRIM [3:0].

Another approach is illustrated in FIGS. 5A–5I, in which the trimmable delay elements 40 comprise one or more trimmable delay chains 50 and a select multiplexer 52, with the trimmable delay chains 50 being selected according to delay select or enable signals DELAYEN0 and DELAYEN1 from a delay circuit select circuit 56 in the control and timing circuit 22. In this example, the trimmable delay chains include a plurality of inverter delay components 70 coupled along a plurality of possible signal paths between the signal input TAPIN and a delay chain output, as well as switching circuitry that couples certain ones of delay components 70 between the signal input TAPIN and the delay chain output according to the trim inputs TRIM[3:0] to set the variable delay time.

Figure 7:
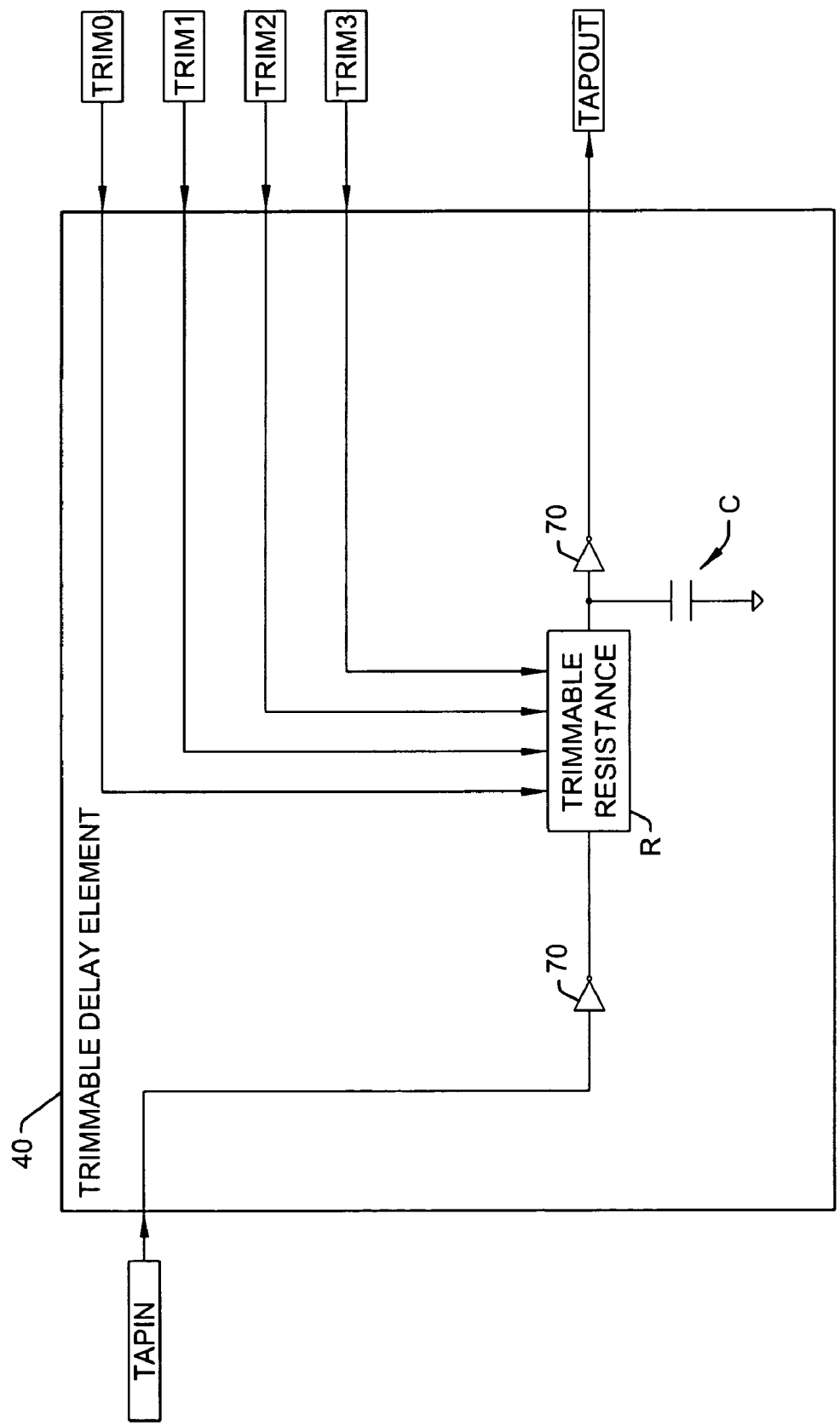
FIG. 7 is a schematic diagram illustrating another implementation of a trimmable delay element comprising an RC delay network with a trimmable resistance in accordance with the invention.
Figure 8:
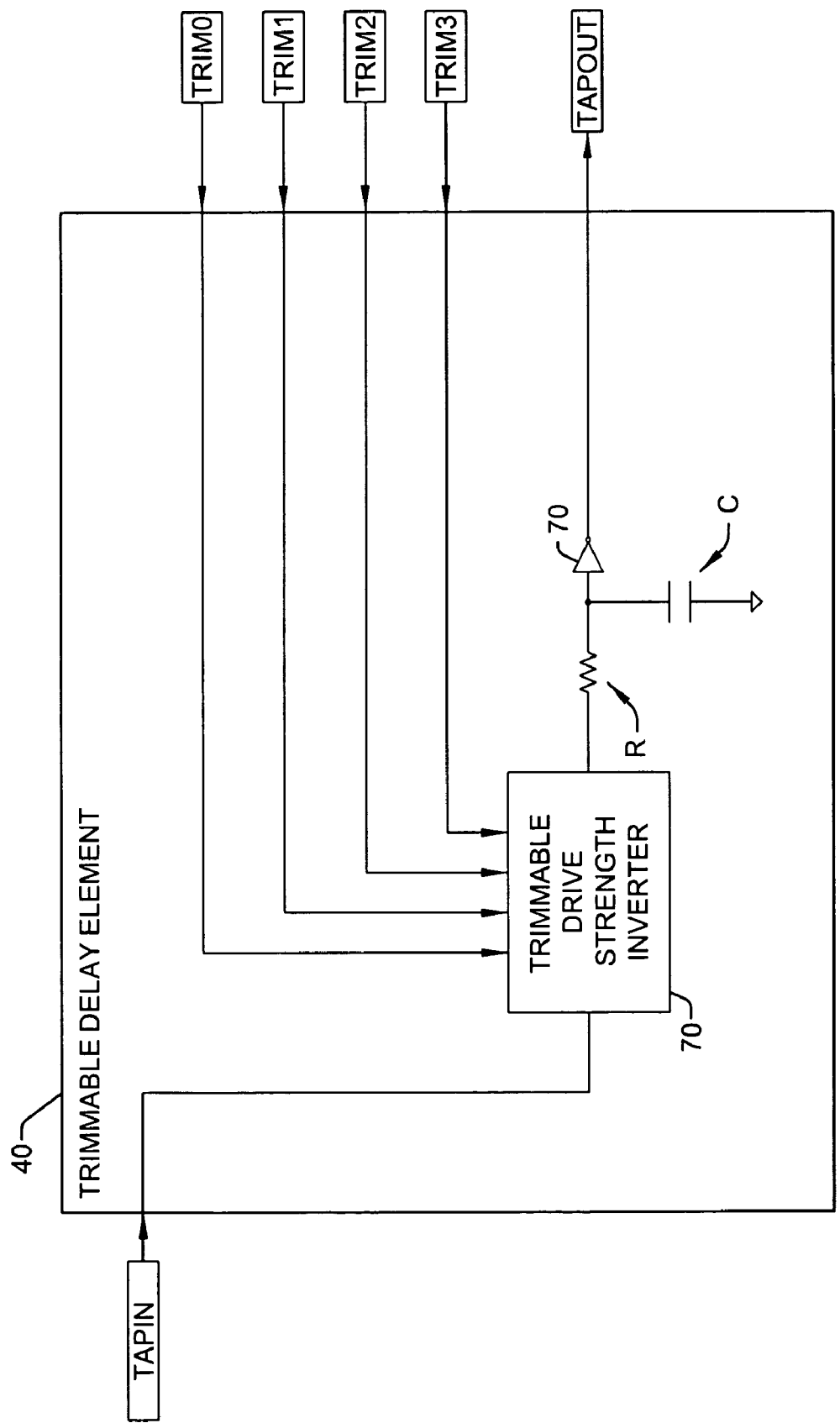
FIG. 8 is a schematic diagram illustrating another implementation of a trimmable delay element comprising an RC delay network with a trimmable drive strength inverter in accordance with the invention.
Figure 9:
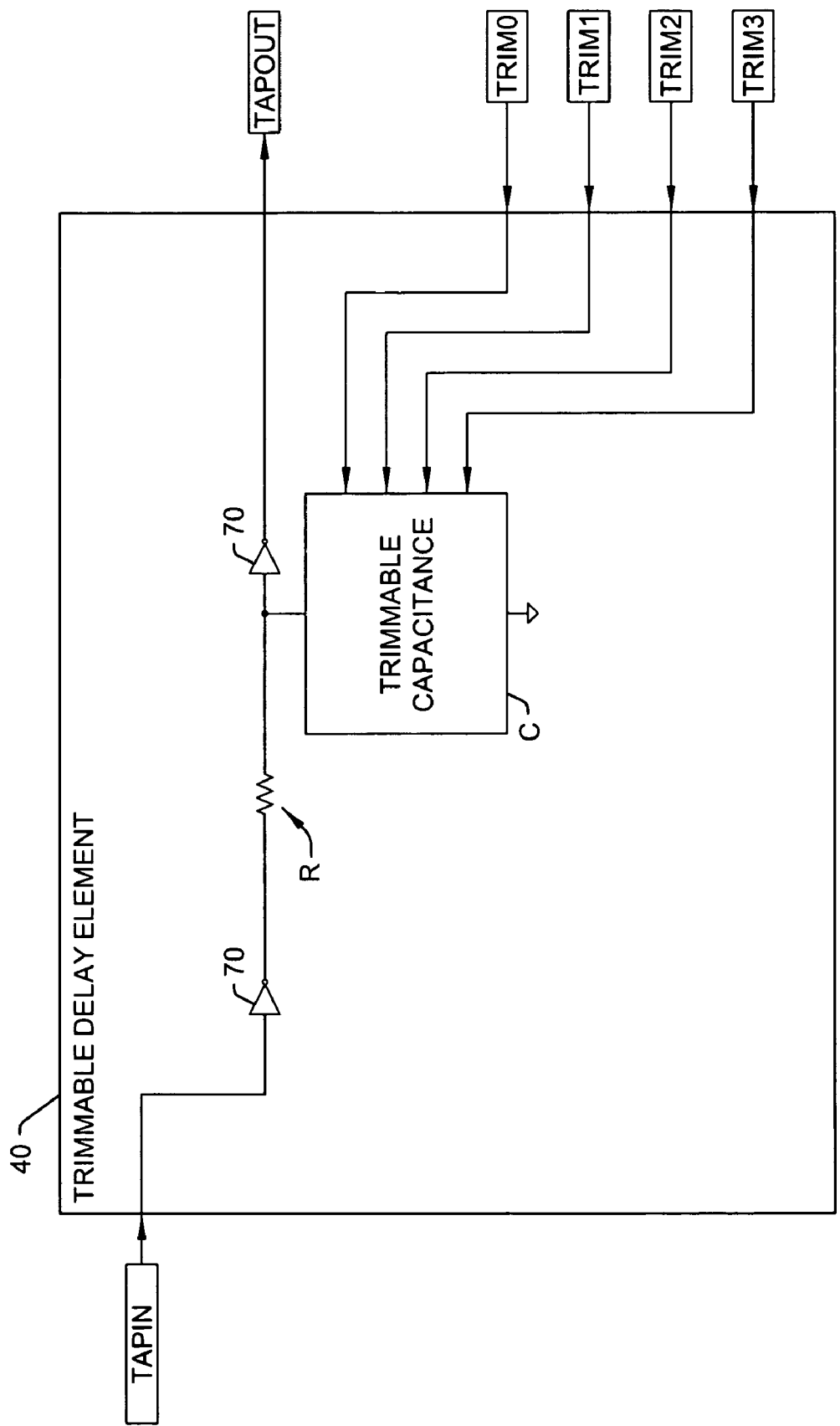
FIG. 9 is a schematic diagram illustrating another implementation of a trimmable delay element comprising an RC delay network with a trimmable capacitance in accordance with the invention.

Further exemplary implementations are illustrated in FIGS. 7–9, where the variable delay circuit comprises an RC network with a resistor R and a capacitor C and one or more drive transistors forming an inverter 70, wherein values of the resistor R, the capacitor C, and/or the transistor drive current capability (e.g., drive strength) are trimmable according to the trim inputs TRIM[3:0] to set or adjust the variable delay time.

The trimmable delay elements 40 in the delay system may be individually trimmed using one or more dedicated trim inputs for each delay element 40, or may be all trimmed by a single set of trim inputs, or may be trimmed in groups, wherein all such variations are contemplated as falling within the scope of the invention and the appended claims. For example, a single set of one or more trim signals may be concurrently applied to all the trimmable delay elements 40 in the circuit 22. FIGS. 3A and 3B illustrate another possible implementation, wherein three separate sets or groups of four trim inputs TRIMA[3:0], TRIMB[3:0], and TRIMC[3:0] are generated by the trim select circuit 44. As illustrated in FIG. 3B, the delay elements 40 in this implementation are grouped according to row location in the delay element array, wherein the trim input set TRIMA[3:0] is provided to the active delay elements 40 in first and third rows (e.g., group "A"), trim input set TRIMB[3:0] is provided to the active delay elements 40 in second and fifth rows (e.g., group "B"), and the trim input set TRIMC[3:0] is provided to the active delay elements 40 in third and sixth rows (e.g., group "C"). This exemplary grouping provides a first group (group "A") having 14 delay elements 40, a second group (group "B") having 20 delay elements 40, and a third group (group "C") having 15 delay elements 40, wherein FIGS. 6B and 6C below illustrate an example of a trimming procedure using the grouped implementation of FIGS. 3A, 3B, and 5A–5I. Other groupings are possible within the scope of the invention, wherein the trim grouping of FIGS. 3B and 5A–5I is merely one example. In addition, the exemplary trim select circuit 44 is programmable and includes non-volatile storage, such as ferroelectric memory cells, electronic fuses (e.g., e-fuses), etc., for storing the trim input signal values TRIMA[3:0], TRIMB[3:0], and TRIMC[3:0].

In FIGS. 3A, 3B, and 5A–5I, the exemplary delay elements 40 individually comprise four selectable delay chains 50a–50d, wherein a single set of delay select inputs DELAYEN[1:0] are provided by the delay select logic circuit 56 to each of the trimmable delay elements 40, although this is not a strict requirement of the invention. Other implementations are possible, for example, wherein delay chain circuits 50 are selected individually for the delay elements 40, or in groups of delay elements 40, where such groupings may be the same or different from the trim groupings, wherein all such variant implementations are contemplated as falling within the scope of the invention and the appended claims.

Figure 5A:
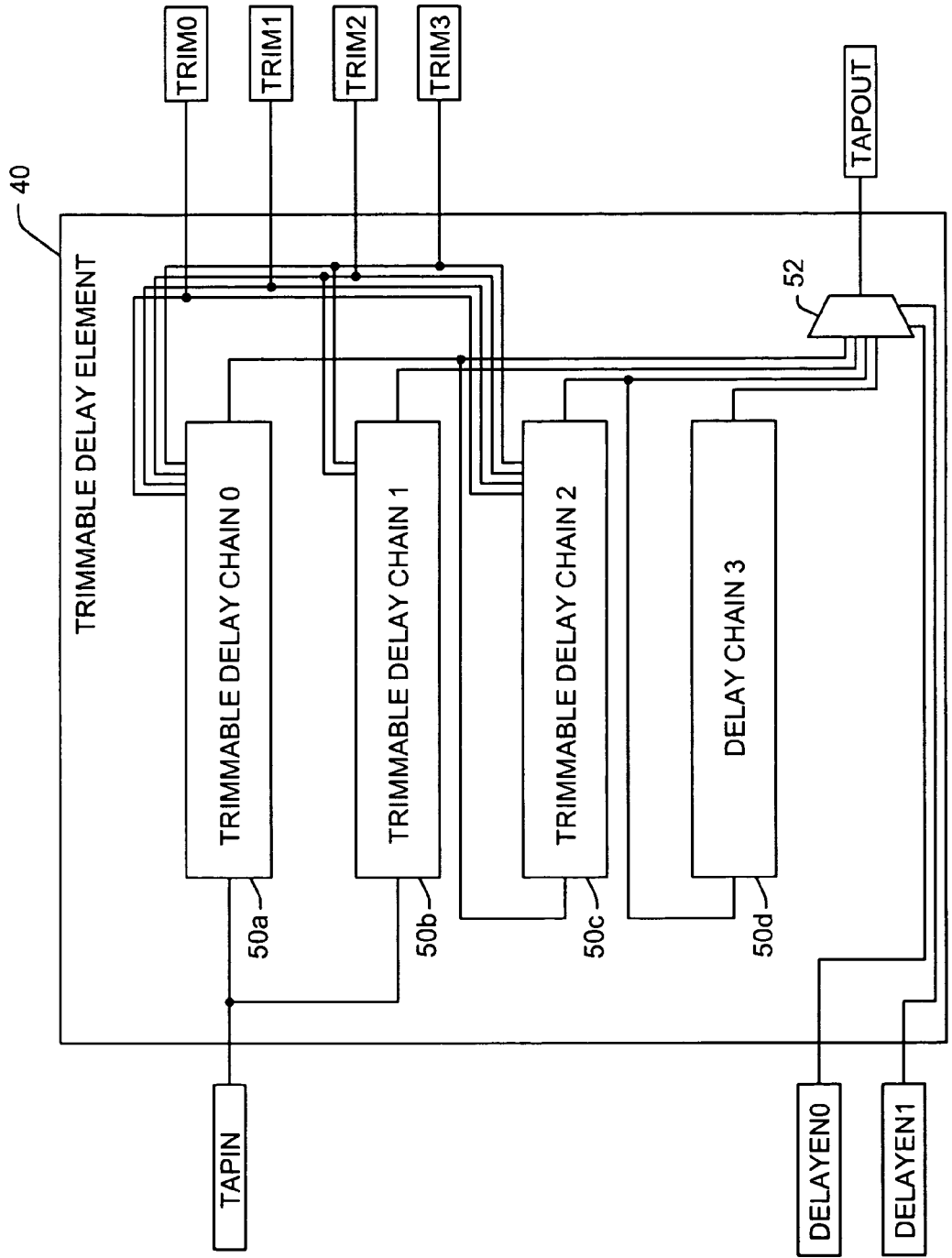
FIGS. 5A–5I are schematic diagrams illustrating another trimmable delay element in accordance with the invention, comprising a trimmable delay chain with a plurality of delay components coupled along a plurality of possible signal paths between the signal input and a delay chain output, as well as switching circuitry that couples certain ones of delay components between the signal input and the delay chain output according to the trim inputs to set the variable delay time.

As illustrated in FIG. 5A, the exemplary trimmable delay element 40 comprises four delay chains 50a–50d providing output signals to the delay circuit select circuit multiplexer 52, where the first three chains 50a–50c are trimmable, and the fourth chain 50d is fixed. In this example, selection of the first trimmable delay chain 50a provides a variable delay time of about 0.50 ns for the trimmable delay element 40, subject to adjustment through the trim inputs TRIM[3:0] as well as variation according to process, voltage, and/or temperature. Similarly, the second trimmable delay chain 50b provides a variable delay time value of about 0.25 ns for the trimmable delay element 40. In this regard, the trimmable delay chains 50a and 50b receive input signals from the delay element signal input TAPIN and provide delay chain outputs to the multiplexer 52.

The third trimmable delay chain 50c receives the chain output from the first chain 50a as an input, and the fourth trimmable delay chain 50d receives the output from the third chain 50c as an input, wherein the third chain 50c itself provides about 0.50 ns delay and the fourth chain 50d itself provides about 1.0 ns of delay. In this manner, the selection of the third chain 50c provides a total delay of about 1.0 ns at the signal output TAPOUT (0.5 ns+0.5 ns), and selection of the fourth chain 50d provides a total delay of about 2.0 ns (0.5 ns+0.5 ns+1.0 ns). A selected one of the delay chain output signals is provided as the signal output TAPOUT of the delay element 40 according to the delay select inputs DELAYEN[1:0] from the delay select logic circuit 56 (FIG. 3A) via the multiplexer 52.

Figure 5B:
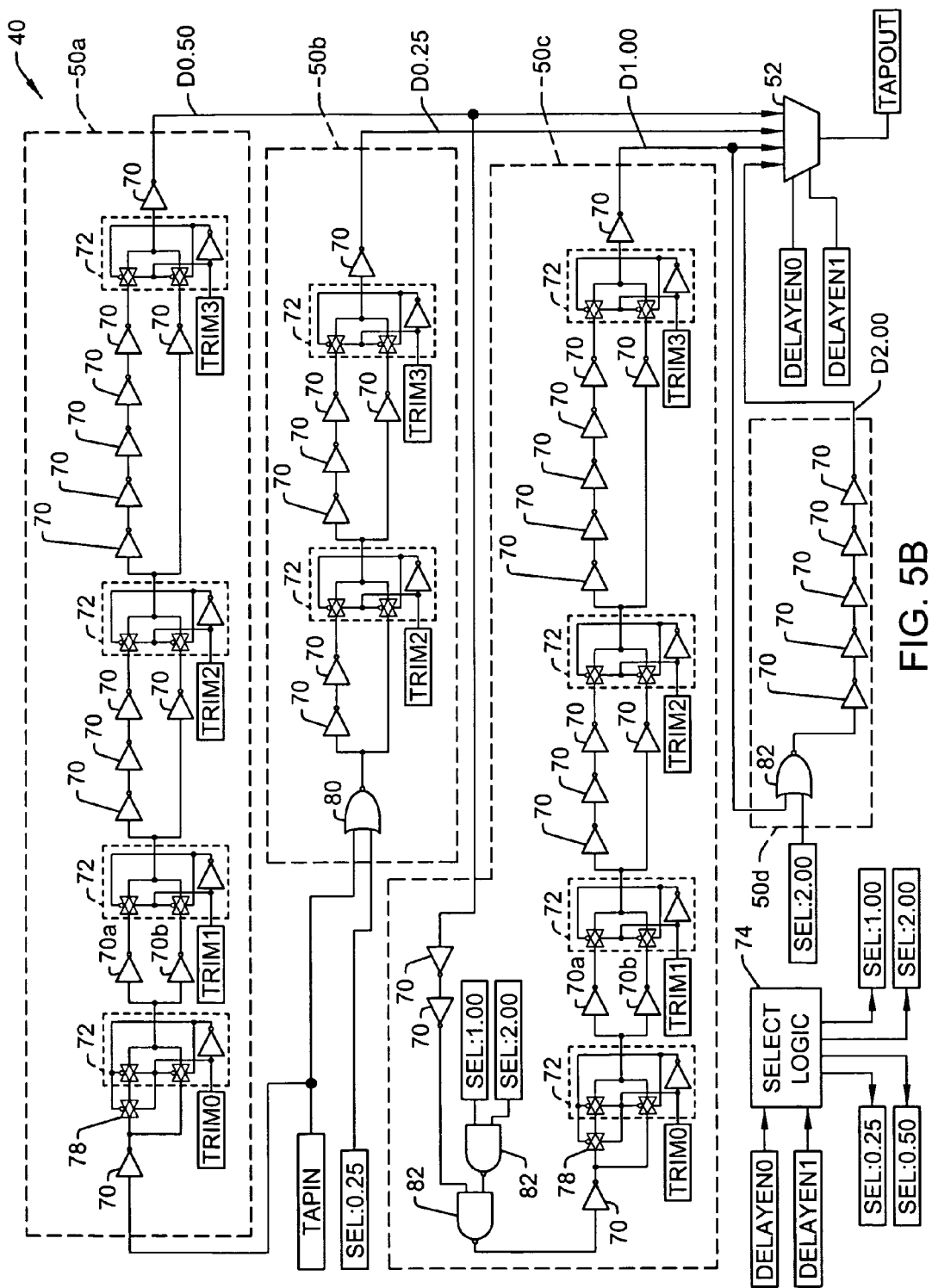
Figures 5C, 5D:
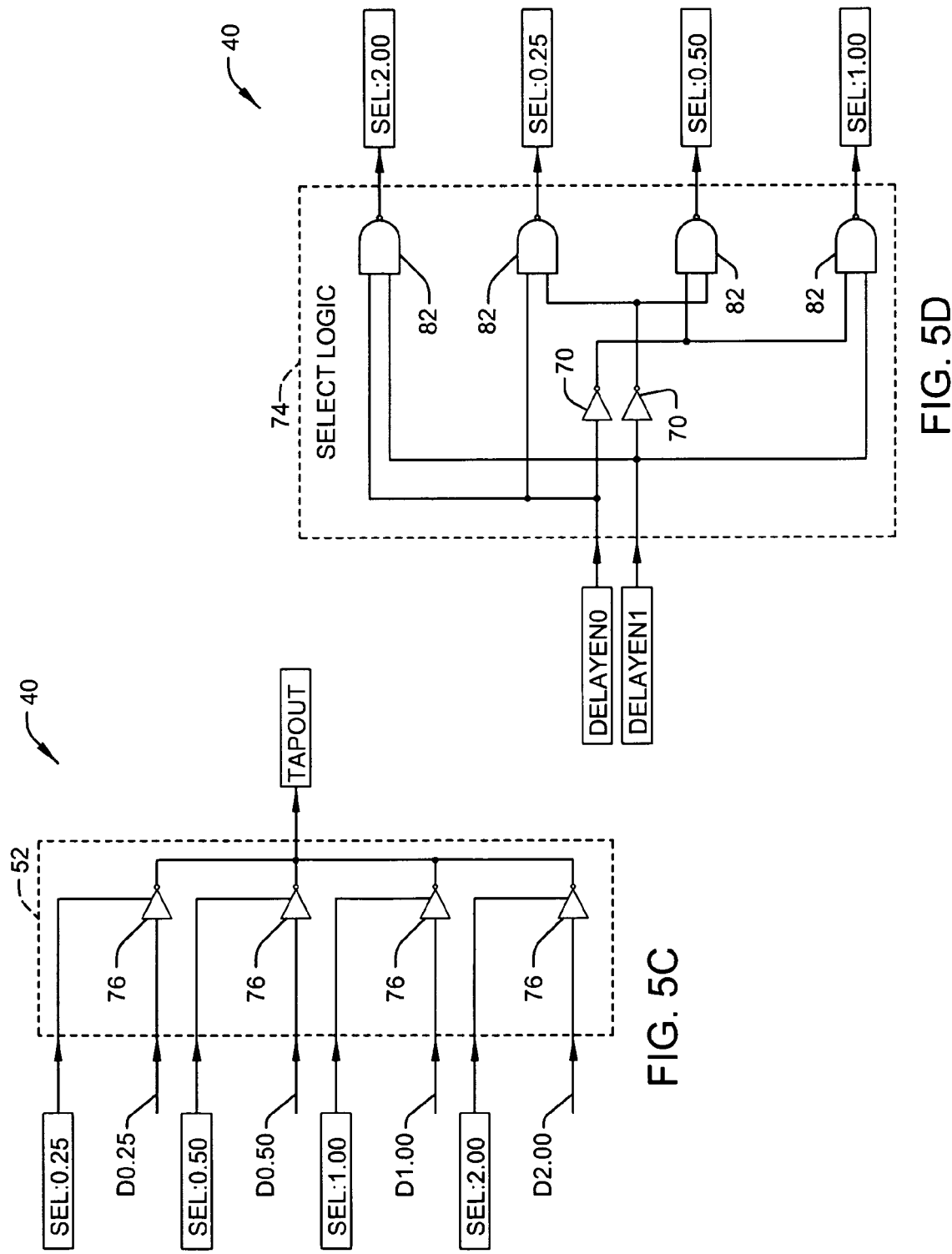
Figure 5E:
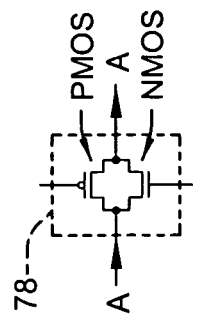

FIGS. 5B–5I illustrate further details of the exemplary trimmable delay element 40 of FIG. 5A. As illustrated in FIG. 5B, each of the trimmable delay chains 50a–50d comprises a plurality of inverter delay components 70 coupled along a plurality of possible signal paths, wherein each segment has switching circuitry (e.g., a two input segment multiplexer) 72 that selectively couples one of the path ends to the next segment input according to a corresponding trim input. In this manner, the switching circuitry multiplexers 72 couple certain ones of the inverters 70 between the input and output of the trimmable delay chain 50 according to one, some, or all of the trim inputs TRIM [3:0] to set the variable delay time of the delay element 40. FIG. 5E illustrates one suitable CMOS implementation of the various inverters 70 in the delay element 40, comprising a PMOS transistor and an NMOS transistor coupled to invert the binary state of the inverter input signal.

Figure 5F:
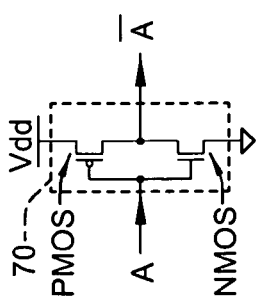
Figure 5G:
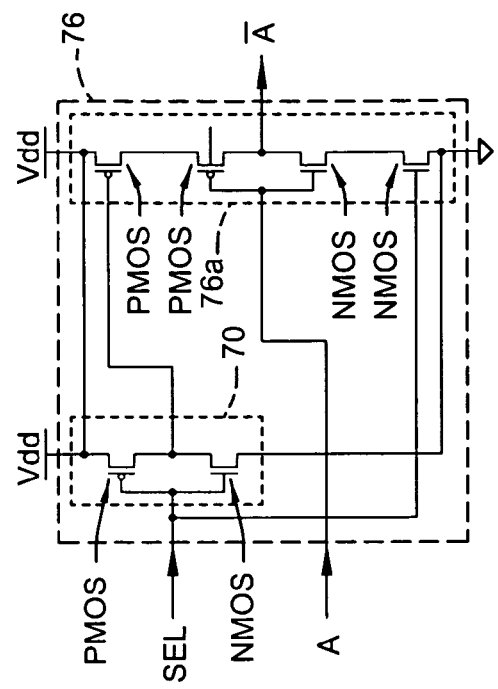
Figure 5H:
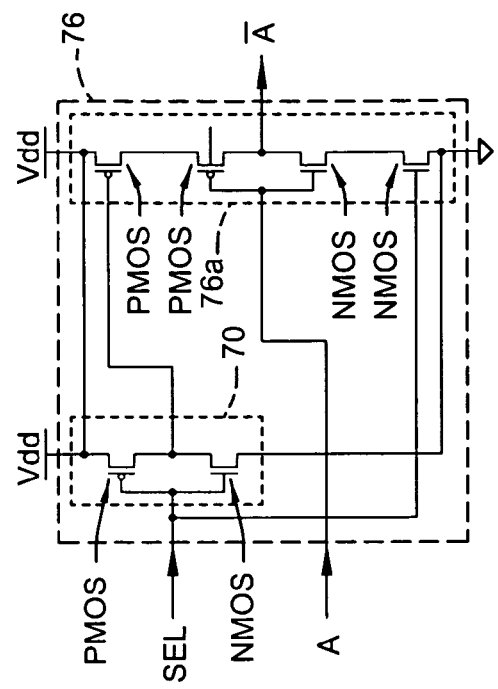
Figure 5I:
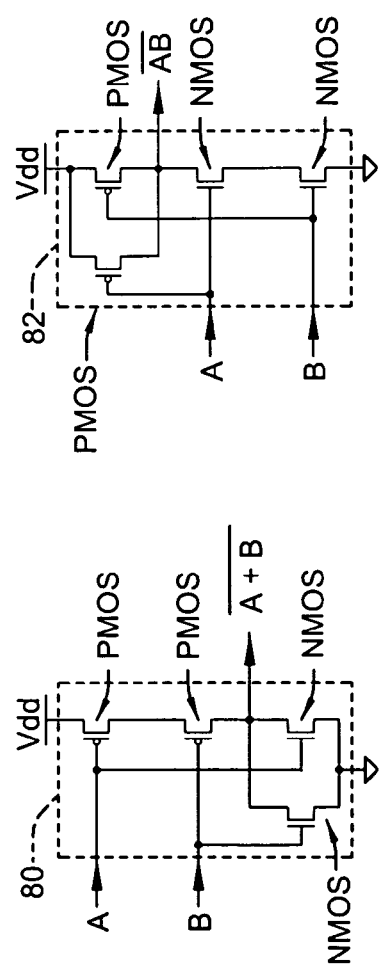

The delay element 40 also comprises select logic 74 (FIGS. 5B and 5D) that may be constructed as part of the delay element multiplexer 52, where the logic 74 and the multiplexer 52 receive the select inputs DELAYEN[1:0], with the multiplexer 52 receiving the chain outputs and providing the delay element signal output TAPOUT. As illustrated in FIG. 5D, the select logic 74 receives the select inputs DELAYEN[1:0] and decodes these into four individual chain select signals SEL:2.00, SEL:1.00, SEL:0.50, and SEL:0.25 used for selecting the particular trimmable delay chain output that is used to provide the delay element signal output TAPOUT, as well as to selectively enable the chains 50b–50d and selectively couple the chain inputs of the third and fourth chains 50c and 50d with the outputs of the first and third chains 50a and 50c, respectively. FIG. 5C illustrates a detailed implementation of the multiplexer 52 comprising four tri-state inverters 76 selected according to corresponding chain select signals SEL:2.00, SEL:1.00, SEL:0.50, and SEL:0.25 from the select logic 74 to provide the delay element output TAPOUT as a selected one of the delay chain outputs D2.00, D1.00, D0.50, or D0.25, respectively. FIG. 5I illustrates one possible CMOS implementation of the tri-state inverters 76 in the exemplary delay element 40, comprising PMOS and NMOS transistors coupled to form a CMOS inverter 70 receiving the select input SEL, as well as a tri-state CMOS inverter 76a.

As illustrated in FIG. 5B, the exemplary trimmable delay chains 50a–50c provide two or more segments, each having two possible signal paths with different numbers of inverters 70 between the segment input and the segment output, with a segment multiplexer 72 controlling which path output will be provided as an input to the succeeding segment according to a trim input signal. In the first trimmable delay chain 50a, for example, the signal input TAPIN for the delay element 40 is provided to an initial inverter 70, which presents a segment input to two signal paths of a first segment. In the first segment, a first path includes a t-gate 78 providing a non-zero signal delay between the initial inverter 70 and a first segment multiplexer 72, and a second path directly provides the output of the initial inverter 70 to the multiplexer 72 with essentially no delay. FIG. 5F illustrates one possible implementation of a t-gate 78, comprising a PMOS transistor and an NMOS transistor coupled in parallel between the t-gate input and output. The first segment multiplexer 72 couples the first or second path to the input of the subsequent second segment according to the trim input TRIM0.

The second segment of the first trimmable delay chain 50a provides two paths, each with a single inverter 70, wherein the first (e.g., upper) path includes an inverter 70a and the second (e.g., lower) path includes a different inverter 70*b*, such that the first inverter 70*a* and hence the first path of the second segment provides a longer delay than does the second inverter 70*b* of the second path. The second segment multiplexer 72 selectively couples the output of one of these paths as an input to a third segment according to the trim input TRIM1. In the third segment of the first chain 50*a*, a first signal path comprises three series-coupled inverters 70 and a second path has a single inverter 70. In this third segment, the delay associated with the first path is again longer than that of the second path, wherein the third segment multiplexer 72 couples one of the path outputs to a final fourth segment according to the trim input TRIM2. In the fourth segment, a first signal path comprises five series-coupled inverters 70 and a second path has a single inverter 70, with the delay of the first path being longer than that of the second path, where a fourth segment multiplexer 72 couples the output of one of the paths to a final inverter 70 according to the trim input TRIM3, wherein the output D0.50 of the final inverter 70 is coupled as an input to the delay element multiplexer 52.

The first and third trimmable delay chains 50*a* and 50*c* provide similar delays, wherein the four segments of the third trimmable delay chain 50*c* are essentially the same as those of the first chain 50*a* with the addition of selection logic including NAND gates 82. FIG. 5H illustrates one possible CMOS implementation of the NAND gates 82 in the exemplary trimmable delay element 40. When the delay select inputs are set to select a total variable delay time of about 0.5 ns, (e.g., signal SEL:0.50 is activated by the select logic 74 of FIGS. 5B and 5D), the chain output D:0.50 from the first delay chain 50*a* is presented at the signal output TAPOUT for the trimmable delay element 40. When the delay select inputs are set to select a total variable delay time of about 1.0 ns, (e.g., signal SEL:1.00 is activated), the chain output D:0.50 from the first delay chain 50*a* is presented as an input to the third chain 50*c*, which adds about 0.5 ns of further delay, and the chain output D1.00 from the third trimmable delay chain 50*c* is provided as the output signal TAPOUT by the multiplexer 52. The fourth chain 50*d* itself is essentially fixed (e.g., not trimmable, but may vary with process, temperature, and/or voltage), and when the delay select inputs are set to select a total variable delay time of about 2.0 ns, (e.g., signal SEL:2.00 is activated), the chain output D:0.50 from the first delay chain 50*a* is presented as an input to the third chain 50*c*, and the chain output D:1.00 from the third delay chain 50*c* is presented as an input to the fourth chain 50*d*, yielding a total delay of about 2 ns for the trimmable delay element 40. It is noted that while the fourth chain 50*d* is fixed, the selection of this chain (e.g., SEL:2.00 active) provides a variable delay time for the trimmable delay element 40, since the variable delays of the first and third trimmable delay chains 50*a* and 50*c* are also enabled and contribute to the total element delay time, which can vary with process, voltage, and/or temperature.

The second trimmable delay chain 50*b* is selected via the signal SEL:0.25 from the select logic 74, by which the signal input TAPIN of the trimmable delay element 40 is provided to a first of two dual-path segments trimmable via the TRIM2 and TRIM3 trim inputs. When the chain 50*b* is selected, the TAPIN input is provided to a first segment input via a NOR gate 80, where FIG. 5G illustrates one possible CMOS NOR gate implementation in the exemplary trimmable delay element 40. The first segment of the second trimmable delay chain 50*b* has a first signal path comprising two series-coupled inverter delay components 70 and a second path with essentially no delay, where the path outputs are fed as inputs to a first segment multiplexer 72. The first multiplexer 72 provides one of the first segment path outputs as an input to the second segment according to the trim input TRIM2. The second segment includes a first signal path with three series-coupled inverters 70, and a second signal path with a single inverter 70, as well as a second segment multiplexer 72 that provides one of the path outputs to a final inverter 70 according to the trim input TRIM3, with the final inverter output being coupled to the delay element multiplexer 52. In this example, selection of the second trimmable delay chain 50*b* provides a variable delay time of about 0.25 ns for the trimmable delay element 40, subject to adjustment through the trim inputs TRIM[3:2] as well as variation according to process, voltage, and/or temperature. It is noted in the exemplary trimmable delay element 40 of FIG. 5B, that the trim inputs TRIM[3:0] are provided to all the trimmable delay chains 50*a*, 50*b*, and 50*c*, whereby adjustment of one sets the trim for the others. Thus, for example, when the 0.5 ns delay chain 50*a* is set or trimmed for process variations (e.g., and or for voltage and/or temperature variations in real-time), the other delay chains 50*b* and 50*c* are also trimmed.

In the exemplary trimmable delay element 40 of FIG. 5B, the first, second, third, and fourth segments in the 4-segment trimmable delay chains 50*a* and 50*c* provide generally binary-weighted delays, wherein the delay of the first segment is about half that of the second segment, which is about half that of the third segments, etc. In this example, therefore, the TRIM3 input signal can be thought of as a most-significant-bit (MSB) and TRIM0 as a least-significant bit (LSB) in a 4-bit binary adjustment scheme for trimming the delay element 40. However, this example is but one possibility, wherein the invention is not limited to binary weighted implementations. Although the illustrated trimmable delay chains 50*a*–50*c* above include segments having dual parallel delay paths, other implementations are possible wherein any number of such paths may be provided in a segment, wherein different segments may have different numbers of such paths. Furthermore, the different paths within a segment may be provided with the same number of delay components and/or the delay times associated with individual delay components (e.g., inverters 70) may be different in different segment paths. In addition, trimmable delay elements 40 of the invention may alternatively employ multiple selectable delay circuits (e.g., such as the selectable delay chains 50 in FIGS. 5A–5I, etc.), some of which are trimmable, and/or may comprise a single trimmable delay circuit, such as a single trimmable delay chain 50*a* or other type of circuit that provides a variable delay time according to one ort more trim inputs (e.g., as in the example of FIGS. 7–9 in which the trim inputs are used to adjust drive current, resistance, and/or capacitance alone or in combination with use for selecting different signal paths), wherein all such variant implementations are contemplated as falling within the scope of the present invention and the appended claims.

In the exemplary control circuit 22 of FIGS. 3A, 3B, and 5A–5I, moreover, the trimmable delay elements 40 are grouped for trimming purposes into three groups (e.g., FIG. 3B), group "A" (15 trimmable delay elements 40), group "B" (20 delay elements 40), and group "C" (15 delay elements 40), although the elements 40 may alternatively be grouped differently, or may be individually trimmable, or may be collectively trimmed using a single trim input or a single set of trim inputs within the scope of the invention. In addition, as pointed out above, the exemplary trim select circuit 44 in the device 22 is programmable, comprising non-volatile storage for the trim input signal values TRIMA

[3:0], TRIMB[3:0], and TRIMC[3:0], using any suitable storage medium, including but not limited to ferroelectric memory cells, electronic fuses (e.g., e-fuses), etc.

Figure 6A:
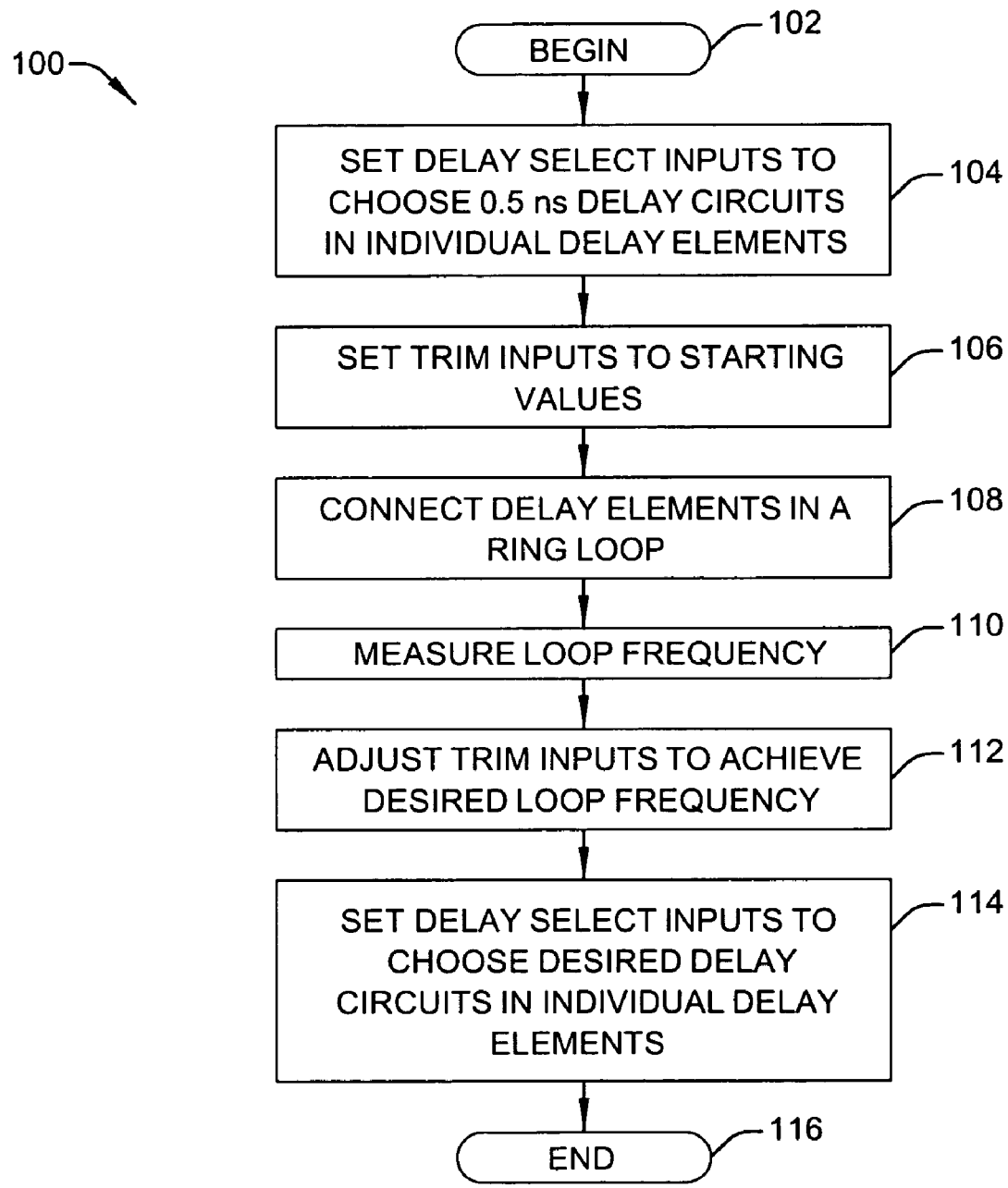
FIG. 6A is a simplified flow diagram illustrating trimming of the delay system in the device of FIGS. 1A–1D and 5A–5I.
Figure 6B:
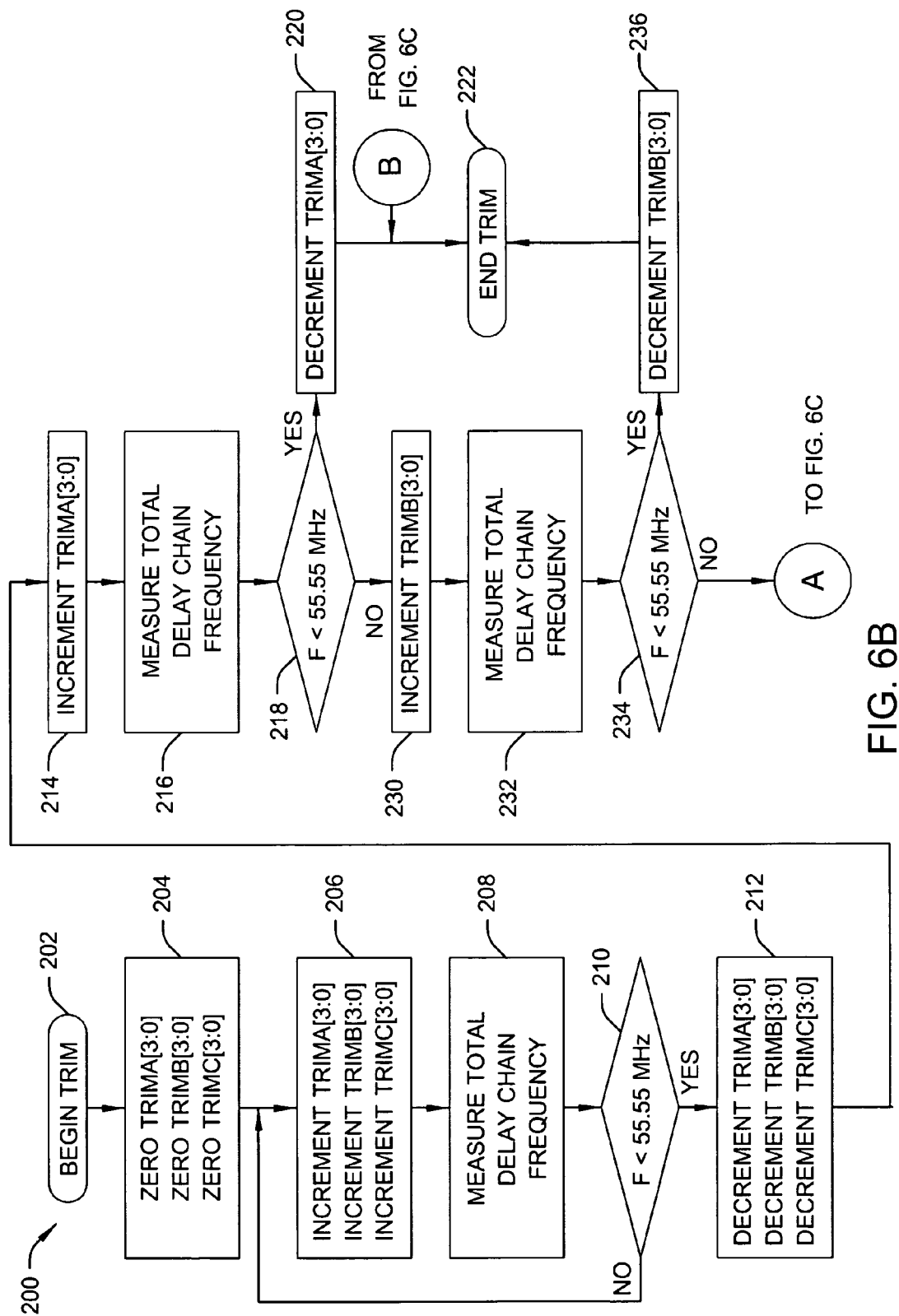
FIGS. 6B and 6C provide a detailed flow diagram illustrating adjustment of the trimmable delay elements in the device of FIGS. 1A–1D and 5A–5I.
Figure 6C:
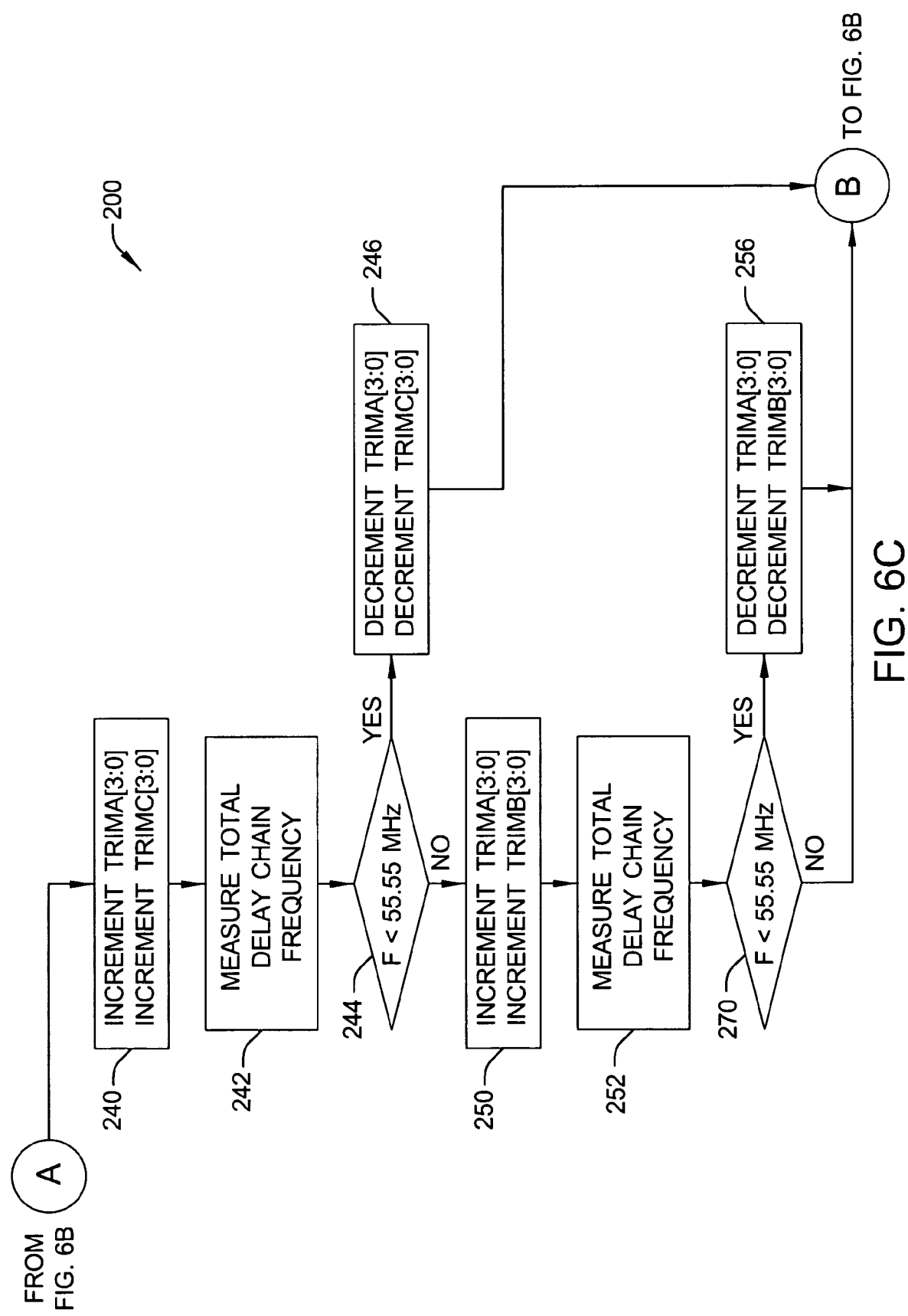

As discussed above, the trim capabilities of the exemplary delay elements 40 in the ferroelectric memory control and timing circuitry 22 can be advantageously employed to correct or compensate for process variations in the fabrication of the ferroelectric memory device 2, particularly where the process-related metric variations of the ferroelectric cell capacitors $C_{FE}$ do not track or otherwise correlate with those of associated logic transistors in the device 2. FIGS. 6A–6C illustrate one possible example of delay system trimming procedure to adjust the variable delay times in a trimmable delay element 40 in accordance with the invention, wherein FIGS. 6B and 6C provide a detailed flow diagram illustrating adjustment of the exemplary trimmable delay elements 40 in the ferroelectric memory device 2 of FIGS. 1A–1D, 3A–3B, and 5A–5I.

FIG. 6A illustrates a general trimming or adjustment process 100 for the device 2. Beginning at 102, the delay select inputs (DELAYEN[1:0] in FIGS. 3A and 5A–5B) are set at 104 to choose the delay circuits (e.g., delay chains 50) in the individual trimmable delay elements 40 according to the desired general delay range for the individual trimmable delay elements 40. In one example, a delay range of about 0.5 ns is selected for all the elements 40 at 104, although not a requirement of the invention, wherein the signal outputs TAPOUT in the chain 42 of delay elements 40 are employed by the control signal logic circuit 36 (FIGS. 3A and 3B) to generate or derive control signals for operation of the ferroelectric memory array 4 during read/restore and/or write access operations where the overall access time (e.g., memory cycle time) is on the order of about 25 ns. At 106, the trim inputs are set to initial or starting values, whether individual, grouped, or collective trimming is used. In the exemplary device 2 above, the trim inputs TRIMA[3:0], TRIMB[3:0], and TRIMC[3:0] are initially zeroed at 106 by the trim select logic circuit 44 (FIG. 3A).

At 108, the delay elements (e.g., the trimmable delay elements 40 and any fixed delay elements in a given delay system) are connected in a ring or loop to facilitate measurement of the delay values. For example, in FIGS. 3A and 3B, the TEST signal is asserted to couple the signal input (TAPIN) of the first delay element 40 with the signal output (TAPOUT) of the last delay element 40, whereby the delay chain 42 forms a continuous delay loop for evaluating the delay time or loop frequency of the system. In one example, the TEST input can be provided to an externally accessible pad in the device for activation using fabrication test equipment (not shown) following device fabrication. At 110, the loop frequency is measured using any suitable test equipment (not shown) and the trim inputs are adjusted at 112 to achieve a desired loop frequency. Thereafter, the delay select inputs (DELAYEN[1:0] in FIGS. 3A and 5A–5B) are set at 114 to choose the desired delay circuits in the individual delay elements before the process 100 ends at 116. One or more measurement and adjustment iterations may be needed, wherein 110 and 112 are repeated as often as necessary, with suitable trim input signal adjustments being made at 112 via the trim select logic 44 (FIG. 3A), wherein the trim select logic circuit 44 itself may be coupled with external test equipment during such adjustment, and wherein the adjustments at 112 may be done for individual trimmable delay elements 40, for groups thereof, or for all the trimmable delay elements 40 collectively.

FIGS. 6B and 6C provide a detailed flow diagram illustrating a detailed adjustment process 200 for use with the exemplary trimmable delay elements 40 in the ferroelectric memory device 2 of FIGS. 1A–1D, 3A–3B, and 5A–5I, wherein the trim input groups TRIMA[3:0], TRIMB[3:0], and TRIMC[3:0] are separately adjustable, and wherein TRIM3 is the MSB and TRIM0 is the LSB for each trim input group. Beginning at 202, the trim inputs TRIMA[3:0], TRIMB[3:0], and TRIMC[3:0] are initially zeroed (e.g., binary 0000 for all groups) at 204 by the trim select logic circuit 44 (FIG. 3A). At 206, the trim inputs for all groups are incremented (e.g., binary 0001 for each group), and the total delay chain frequency is measured at 208 (e.g., with the TEST signal asserted in FIGS. 3A and 3B).

A determination is made at 210 as to whether the loop frequency is less than 55.55 MHz (e.g., total loop delay is greater than about 18 ns). If the loop frequency is above 55.55 MHz (NO at 210), the trim inputs of all groups are again incremented at 206 and the loop frequency is again measured at 208. The adjustment and measurement at 206 and 208 are repeated as necessary until the loop frequency transitions below 55.55 MHz (YES) at 210. It is noted that in this example, the loop frequency is compared to 55.55 MHz, which corresponds to a delay time of about 0.37 ns per trimmable delay element 40 in the loop 42. However, any target loop delay or corresponding loop frequency can be used within the scope of the invention.

At 212, each of the groups of trim inputs TRIMA[3:0], TRIMB[3:0], and TRIMC[3:0] are decremented and the group "A" trim inputs TRIMA[3:0] are incremented at 214. It is noted at this point that the first group "A" of trimmable delay elements 40 comprises the smallest number (15) of the 50 delay elements 40 in the chain 42, wherein adjustment of one LSB in the group "A" trim value is the smallest incremental adjustment of the overall delay frequency. The frequency is again measured at 216 to determine at 218 whether the incrementing of the group "A" trim inputs at 214 caused the frequency to rise above 55.55 MHz. If the frequency remains below 55.55 MHz (YES at 218), the group "A" trim inputs the group "A" trim inputs are decremented at 220 and the trim procedure ends at 222. In this instance, since the "A" group is the smallest contingent in the delay chain 42, the final value of trim inputs TRIMA[3:0], TRIMB[3:0], and TRIMC[3:0] at 220 represents the closest trim value to the desired loop frequency (e.g., 55.55 MHz in this example), without falling below the desired value.

However, if the frequency remains above 55.55 MHz as measured at 216 (NO at 218), the trim inputs TRIMB[3:0] for the "B" group are incremented at 230 and the loop frequency is again measured at 232. It is noted at this point that the "B" group has the highest number of trimmable delay elements 40 (twenty in the exemplary device 2). A determination is then made at 234 as to whether the delay loop frequency is below 55.55 MHz. If so (YES at 234), the "B" group trim inputs are decremented at 236 and the trim process 200 ends at 222. Otherwise, (NO at 234), the process 200 proceeds to 240 in FIG. 6C, where the trim inputs for both the "A" and "C" groups are incremented and the loop frequency is again measured at 242 and a determination is made at 244 as to whether the frequency has transitioned below 55.55 MHz as a result. If so (YES at 244), the "A" and "C" groups are decremented at 246 and the process 200 ends at 222 (FIG. 6B). Otherwise (NO at 244), the "A" and "B" groups are incremented at 250 and the frequency is again measured at 252. If the frequency remains above 55.55 MHz (NO at 270), the process 200 ends at 222 in FIG. 6B, otherwise (YES at 270), the trim inputs for the "A" and "B" groups are decremented at 256 before the process 200 ends at 222.

It is noted in the illustrated example, that the incrementing and decrementing of the trim inputs is done one LSB at a time, wherein the trimmable segment selection via the segment multiplexers 72 (FIG. 5B) provides binary weighted delay adjustments. Furthermore, in the above example, the relative weighting of the three groups "A", "B", and "C" of trimmable delay elements 40 (14, 20, and 15) is accounted for in the trim process 200 of FIGS. 6B and 6C, wherein adjusting (e.g., incrementing or decrementing the "A" group by one LSB) provides the smallest change to the overall loop delay or loop frequency. Other implementations are possible, wherein different incremental changes are provided in the design of the trimmable delay elements, which need not be binary weighted, and/or wherein groupings of delay elements 40 are different (e.g., or the elements 40 are individually trimmed or are collectively trimmed without groupings), with different trimming processes or algorithms being possible.

Figure 10:
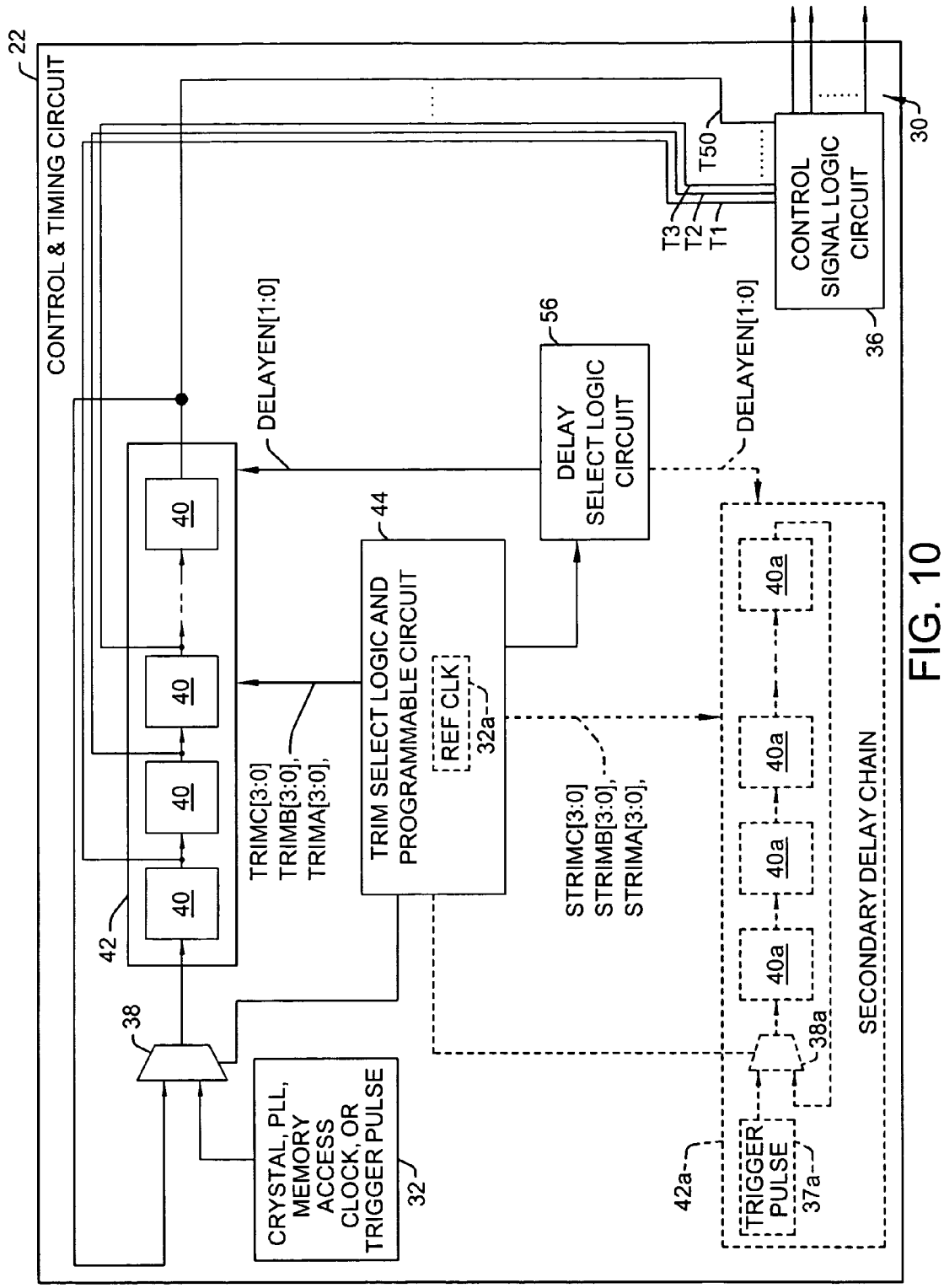
FIG. 10 is a schematic diagram illustrating the control and timing circuit of FIGS. 3A and 3B having an optional secondary trimmable delay chain, wherein a trim select circuit provides real-time trimming to compensate for voltage and/or temperature variations in the trimmable delay chain in accordance with another aspect of the invention.

Referring now to FIG. 10, another feature of the invention provides for real-time or field adjustment (e.g., trimming), which may be carried out to compensate for temperature and/or voltage variations in ferroelectric memory devices, alone or in combination with trimming for process variations during manufacturing as illustrated and described above. In this regard, FIG. 10 illustrates a real-time trimmable delay system in the control and timing circuit 22, wherein the trim select circuit 44 includes a state machine or other logic circuitry that trims the delay chain 42, either during idle periods in which no memory accesses are being undertaken, for example, using the above described techniques (e.g., as per the exemplary methods of FIGS. 6A–6C or others) as would have been done with a tester, only in real-time. As illustrated in FIG. 10, the test mode or trim mode of the active delay chain 42 may thus be controlled by the trim select circuit 44, including placement of the multiplexer 38 into the 'test' or 'trim' mode during idle times. In this case, the trim select circuit 44 trims one or more trimmable delay elements 40 in the chain 42 by causing the delay select circuit 56 to select one of the selectable delay chains in the elements 40 via the signals DELAYEN[1:0], and applying trim signals TRIMA[3:0], TRIMB[3:0], and TRIMC[3:0]. The corresponding chain delay or loop frequency is then measured and the circuit 44 determines whether the corresponding delay is acceptable. For example, the trim select circuit 44 may generally implement the procedure of FIG. 6A above, wherein the trim signals TRIMA[3:0], TRIMB [3:0], and TRIMC[3:0] are adjusted to achieve a desired loop frequency, thereby trimming out any voltage and/or temperature effects that may have changed operation of the chain 42 since the last trim operation.

Alternatively or in combination, a secondary delay chain 42a can be constructed in the control and timing circuit 22 (e.g., as illustrated in FIG. 10) or elsewhere in the ferroelectric memory device, which is constantly or periodically trimmed as described above using secondary trim signals (e.g., STRIMA[3:0], STRIMB[3:0], and STRIMC[3:0] in FIG. 10) provided by the trim select circuit 44. The secondary delay chain 42a can be a duplicate of the active delay chain 42, or alternatively may be a ratioed version of the active chain 42. The trim select logic circuit 44 may include a reference clock 32a and suitable logic circuitry to selectively couple a trigger pulse input 37a to the chain of secondary delay elements 40a via a mux 38a, and to then switch the mux 38a to place the elements 40a in a ring or loop. The circuit 44 then monitors the resulting loop frequency or delay value, compares the value to a reference clock 32a, and makes appropriate adjustments to the trim signals until an acceptable set of secondary trim signals (e.g., STRIMA[3:0], STRIMB[3:0], and STRIMC[3:0]) is obtained.

In the case where the secondary chain 42 is essentially a duplicate of the active chain 42, the reference clock 32a can be constructed to provide the equivalent reference frequency or period as used in the above example of manufacturing trimming (e.g., about 55.55 MHz at room temperature in the above example), wherein temperature, aging, and voltage related drift of the reference clock 32a will generally track that of the delay elements 40a. Alternatively, the secondary delay elements 40a or the secondary delay chain 42a may be constructed to provide delays that are a generally constant fraction of those seen in the active chain 42, in which case the reference clock 32a likewise provides a ratioed period value or frequency, such that trimming of the secondary chain 42 using a given set of trim values STRIMA[3:0], STRIMB[3:0], and STRIMC[3:0] will provide corresponding trimming when applied as the active chain trim signals TRIMA[3:0], TRIMB[3:0], and TRIMC[3:0].

The secondary trim signals are then stored in registers of the circuit 44. Thereafter, when the memory device is in an idle mode, the active chain 42 is trimmed using these secondary values, for example, wherein the acceptable set of secondary trim inputs STRIMA[3:0], STRIMB[3:0], and STRIMC[3:0] are transferred from the corresponding registers in the trim select circuit 44 to non-volatile memory registers in the circuit 44 corresponding to the active trim inputs TRIMA[3:0], TRIMB[3:0], and TRIMC[3:0], whereby the resulting updated trim values are applied to the active chain 42 when idling and thereafter. This alternate form of real-time trimming can be provided alone or in combination with initial process trimming at production so as to compensate for voltage and/or temperature related variations in the device.

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A delay system for generating control signals in a ferroelectric memory device, comprising:

a plurality of series connected delay elements comprising a first delay element, a last delay element, and one or more intermediate delay elements, the delay elements individually comprising:
   a signal input,
   a signal output, and
   a delay circuit that receives an input signal from the signal input and provides an output signal to the signal output delayed in time after the input signal;
wherein the signal inputs of the intermediate delay elements and the last delay element are coupled with the signal output of the immediately preceding delay element, and the signal input of the first delay element is coupled with a system input,
wherein at least one of the delay elements is a trimmable delay element comprising at least one trim input and a variable delay circuit that receives an input signal from the signal input of the trimmable delay element and provides an output signal to the signal output of the trimmable delay element a variable delay time after the input signal to the trimmable delay element, the variable delay time being set according to the at least one trim input; and
a trim select circuit comprising at least one trim output coupled with the at least one trim input of the trimmable delay element, the trim select circuit providing at least one trim signal to the at least one trim input to control the variable delay time.

2. The system of claim 1, wherein the delay elements individually comprise:
   a plurality of delay circuits coupled with the signal input, each delay circuit receiving an input signal from the signal input and providing an output signal delayed in time after the input signal; and
   a delay circuit select circuit coupled with the signal output and with the plurality of delay circuits, the delay circuit select circuit receiving the output signals from the delay circuits and selectively coupling one of the output signals to the signal output according to at least one delay select input;
   wherein the delay system further comprises a delay select logic circuit coupled with the delay elements and providing the least one delay select input to select the output signal to be applied to the signal output.

3. The system of claim 2, further comprising a control signal logic circuit coupled with the signal outputs of the delay elements, the control signal logic circuit providing one or more control signals in the ferroelectric memory device according to at least one of the signal outputs of the delay elements.

4. The system of claim 1, further comprising a control signal logic circuit coupled with the signal outputs of the delay elements, the control signal logic circuit providing one or more control signals in the ferroelectric memory device according to at least one of the signal outputs of the delay elements.

5. The system of claim 1, wherein the trimmable delay element comprises a plurality of delay chains coupled with the signal input, the delay chains individually comprising one or more delay components coupled between the signal input and a delay chain output; and
   a multiplexer coupled with the delay chain outputs and with the at least one trim input, the multiplexer selectively coupling one of the delay chain outputs to the signal output according to the at least one trim input.

6. The system of claim 1, wherein the trimmable delay element comprises a trimmable delay chain coupled with the signal input, the trimmable delay chain comprising:
   a plurality of delay components coupled along a plurality of possible signal paths between the signal input and a delay chain output coupled with the signal output; and
   switching circuitry coupled with one or more of the delay components and with the at least one trim input, wherein the switching circuitry couples certain ones of delay components between the signal input and the delay chain output according to the at least one trim input to set the variable delay time.

7. The system of claim 6, wherein the trimmable delay chain comprises a plurality of segments coupled in series between the signal input and the signal output, the individual chain segments comprising:
   a segment input;
   a segment output;
   a plurality of segment signal paths coupled with the segment input, the segment paths individually comprising a plurality of delay components coupled between the segment input and a signal path output; and
   a segment multiplexer coupled with the segment output, the signal path outputs, and with one or more trim inputs, the segment multiplexer selectively coupling the segment output with one of the signal path outputs according to the one or more trim inputs.

8. The system of claim 7, wherein the delay elements individually comprise:
   a plurality of trimmable delay chains individually coupled with the signal input or an output of another trimmable delay chain; and
   a delay circuit select circuit coupled with the signal output and with the plurality of trimmable delay chains, the delay circuit select circuit receiving the output signals from the trimmable delay chains and selectively coupling one of the output signals to the signal output according to at least one delay select input;
   wherein the delay system further comprises a delay select logic circuit coupled with the delay elements and providing the least one delay select input to select the output signal to be applied to the signal output.

9. The system of claim 1, wherein the variable delay circuit comprises an RC network with a resistor and a capacitor, wherein values of the resistor and the capacitor control the variable delay time, and wherein the resistor is a trimmable resistor with a resistance value set according to the at least one trim input to control the variable delay time.

10. The system of claim 1, wherein the variable delay circuit comprises a delay circuit with a trimmable drive strength that is set according to the at least one trim input to control the variable delay time.

11. The system of claim 1, wherein the variable delay circuit comprises an RC network with a resistor and a capacitor, wherein values of the resistor and the capacitor control the variable delay time, and wherein the capacitor is a trimmable capacitor with a capacitance value set according to the at least one trim input to control the variable delay time.

12. The system of claim 1, wherein the trim select circuit comprises non-volatile storage for the at least one trim output.

13. The system of claim 1, wherein the trim select circuit is adapted to trim the plurality of series connected delay elements by applying at least one trim signal thereto, determining whether a corresponding delay is acceptable, and applying an adjusted trim signal to achieve a desired variable delay time.

14. The system of claim 1, further comprising a secondary plurality of series connected secondary delay elements, wherein at least one of the secondary delay elements is a trimmable secondary delay element comprising at least one secondary trim input and a variable delay circuit that receives an input signal from the signal input of the trimmable secondary delay element and provides an output signal to the signal output of the trimmable secondary delay element a variable delay time after the input signal to the trimmable secondary delay element, the variable delay time being set according to the at least one secondary trim input, wherein the trim select circuit comprises at least one secondary trim output coupled with the at least one secondary trim input, wherein the trim select circuit is adapted to trim the secondary plurality of series connected secondary delay elements by applying at least one secondary trim signal thereto and determining whether a corresponding delay is acceptable, and wherein the trim select circuit is adapted to trim the plurality of series connected delay elements according to at least one secondary trim signal corresponding to an acceptable delay of the secondary plurality of series connected secondary delay elements.

15. A ferroelectric memory device, comprising:
   an array of ferroelectric memory cells accessible for storing data according to one or more control signals; and
   a control and timing circuit coupled with the ferroelectric memory array, the control and timing circuit providing the control signals to the ferroelectric memory array for memory access operations, the control and timing circuit comprising:
      a delay system for generating control signals in a ferroelectric memory device, comprising:
         a plurality of series connected delay elements comprising a first delay element, a last delay element, and one or more intermediate delay elements, the delay elements individually comprising:
            a signal input,
            a signal output, and
            a delay circuit that receives an input signal from the signal input and provides an output signal to the signal output delayed in time after the input signal;
         wherein the signal inputs of the intermediate delay elements and the last delay element are coupled with the signal output of the immediately preceding delay element, and the signal input of the first delay element is coupled with a system input,
         wherein at least one of the delay elements is a trimmable delay element comprising at least one trim input and a variable delay circuit that receives an input signal from the signal input of the trimmable delay element and provides an output signal to the signal output of the trimmable delay element a variable delay time after the input signal to the trimmable delay element, the variable delay time being set according to the at least one trim input; and
         a trim select circuit comprising at least one trim output coupled with the at least one trim input of the trimmable delay element, the trim select circuit providing at least one trim signal to the at least one trim input to control the variable delay time.

16. The ferroelectric memory device of claim 15, wherein the delay elements individually comprise:
   a plurality of delay circuits coupled with the signal input, each delay circuit receiving an input signal from the signal input and providing an output signal delayed in time after the input signal; and
   a delay circuit select circuit coupled with the signal output and with the plurality of delay circuits, the delay circuit select circuit receiving the output signals from the delay circuits and selectively coupling one of the output signals to the signal output according to at least one delay select input;
   wherein the delay system further comprises a delay select logic circuit coupled with the delay elements and providing the least one delay select input to select the output signal to be applied to the signal output.

17. The ferroelectric memory device of claim 16, further comprising a control signal logic circuit coupled with the signal outputs of the delay elements, the control signal logic circuit providing one or more control signals in the ferroelectric memory device according to at least one of the signal outputs of the delay elements.

18. The ferroelectric memory device of claim 15, further comprising a control signal logic circuit coupled with the signal outputs of the delay elements, the control signal logic circuit providing one or more control signals in the ferroelectric memory device according to at least one of the signal outputs of the delay elements.

19. The ferroelectric memory device of claim 15, wherein the trimmable delay element comprises a plurality of delay chains coupled with the signal input, the delay chains individually comprising one or more delay components coupled between the signal input and a delay chain output; and
   a multiplexer coupled with the delay chain outputs and with the at least one trim input, the multiplexer selectively coupling one of the delay chain outputs to the signal output according to the at least one trim input.

20. The ferroelectric memory device of claim 15, wherein the trimmable delay element comprises a trimmable delay chain coupled with the signal input, the trimmable delay chain comprising:
   a plurality of delay components coupled along a plurality of possible signal paths between the signal input and a delay chain output coupled with the signal output; and
   switching circuitry coupled with one or more of the delay components and with the at least one trim input, wherein the switching circuitry couples certain ones of delay components between the signal input and the delay chain output according to the at least one trim input to set the variable delay time.

21. The ferroelectric memory device of claim 15, wherein the variable delay circuit comprises an RC network with a resistor and a capacitor, wherein values of the resistor and the capacitor control the variable delay time, and wherein the resistor is a trimmable resistor with a resistance value set according to the at least one trim input to control the variable delay time.

22. The ferroelectric memory device of claim 15, wherein the variable delay circuit comprises a delay circuit with a trimmable drive strength that is set according to the at least one trim input to control the variable delay time.

23. The ferroelectric memory device of claim 15, wherein the variable delay circuit comprises an RC network with a resistor and a capacitor, wherein values of the resistor and the capacitor control the variable delay time, and wherein the capacitor is a trimmable capacitor with a capacitance value set according to the at least one trim input to control the variable delay time.

24. The ferroelectric memory device of claim 15, wherein the trim select circuit comprises non-volatile storage for the at least one trim output.

25. The ferroelectric memory device of claim 15, wherein the trim select circuit is adapted to trim the plurality of series connected delay elements by applying at least one trim signal thereto, determining whether a corresponding delay is acceptable, and applying an adjusted trim signal to achieve a desired variable delay time.

26. The ferroelectric memory device of claim 15, further comprising a secondary plurality of series connected secondary delay elements, wherein at least one of the secondary delay elements is a trimmable secondary delay element comprising at least one secondary trim input and a variable delay circuit that receives an input signal from the signal input of the trimmable secondary delay element and provides an output signal to the signal output of the trimmable secondary delay element a variable delay time after the input signal to the trimmable secondary delay element, the variable delay time being set according to the at least one secondary trim input, wherein the trim select circuit comprises at least one secondary trim output coupled with the at least one secondary trim input, wherein the trim select circuit is adapted to trim the secondary plurality of series connected secondary delay elements by applying at least one secondary trim signal thereto and determining whether a corresponding delay is acceptable, and wherein the trim select circuit is adapted to trim the plurality of series connected delay elements according to an at least one secondary trim signal corresponding to an acceptable delay of the secondary plurality of series connected secondary delay elements.

\* \* \* \* \*